(12) United States Patent
Kato

(10) Patent No.: US 7,355,248 B2
(45) Date of Patent: Apr. 8, 2008

(54) METAL OXIDE SEMICONDUCTOR (MOS) DEVICE, METAL OXIDE SEMICONDUCTOR (MOS) MEMORY DEVICE, AND METHOD OF MANUFACTURING THE SAME

(75) Inventor: Tatsushi Kato, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/271,922

(22) Filed: Nov. 14, 2005

(65) Prior Publication Data
US 2006/0118871 A1 Jun. 8, 2006

(30) Foreign Application Priority Data
Dec. 7, 2004 (JP) ............... 2004-354108

(51) Int. Cl.
*H01L 27/12* (2006.01)
(52) U.S. Cl. .............. 257/347; 257/217; 257/370; 257/371; 257/374; 257/377; 257/E29.287; 257/E21.562; 257/E21.57
(58) Field of Classification Search ............ 257/369, 257/212, 370, 371, 374, 377, E29.287, E21.207, 257/E21.182, 347
See application file for complete search history.

(56) References Cited

U.S. PATENT DOCUMENTS

| | | | |
|---|---|---|---|
| 4,377,756 A * | 3/1983 | Yoshihara et al. ......... 327/566 |
| 6,670,716 B2 * | 12/2003 | Christensen et al. ........ 257/762 |
| 2001/0025991 A1 * | 10/2001 | Kim ........................... 257/347 |
| 2003/0205765 A1 * | 11/2003 | Masuoka ..................... 257/369 |
| 2003/0230784 A1 * | 12/2003 | Iwata et al. ................. 257/401 |
| 2005/0009306 A1 * | 1/2005 | Mitani et al. ............... 438/479 |
| 2005/0232008 A1 * | 10/2005 | Shukuri et al. ........ 365/185.08 |
| 2006/0131660 A1 * | 6/2006 | Ohsawa ..................... 257/369 |
| 2006/0197111 A1 * | 9/2006 | Matsuzawa ................. 257/206 |

FOREIGN PATENT DOCUMENTS

| JP | A 2000-022160 | 1/2000 |
|---|---|---|
| JP | A 2000-114399 | 4/2000 |
| JP | A 2002-353340 | 12/2002 |

* cited by examiner

*Primary Examiner*—Thao X. Le
*Assistant Examiner*—Marc-Anthony Armand
(74) *Attorney, Agent, or Firm*—Oliff & Berridge, PLC

(57) ABSTRACT

A semiconductor device includes a first semiconductor layer that is formed on a first insulating layer; a second insulating layer that is formed on the first semiconductor layer; a second semiconductor layer that is formed on the second insulating layer; a first gate electrode that is formed on the second semiconductor layer; first conductive-source and drain layers that are formed in the second semiconductor layer and are arranged at sides of the gate electrode; and a first wiring layer that connects the first gate electrode to the first semiconductor layer.

1 Claim, 16 Drawing Sheets

METAL OXIDE SEMICONDUCTOR (MOS) DEVICE, METAL OXIDE SEMICONDUCTOR (MOS) MEMORY DEVICE, AND METHOD OF MANUFACTURING THE SAME

BACKGROUND

1. Technical Field

The present invention relates to a semiconductor device, to a semiconductor memory device, and to a method of manufacturing a semiconductor device. More particularly, the invention is suitable for a dynamic threshold voltage (DT) metal oxide semiconductor (MOS) field effect transistor having a variable threshold voltage during operation.

2. Related Art

In JP-A-2000-114399 and JP-A-2002-353340, which disclose semiconductor memory devices according to the related art, methods have been disclosed in which an N-channel field effect transistor constituting a static random access memory (SRAM) is formed of a DTMOS field effect transistor. According to these methods using the DTMOS field effect transistors, since a channel region is connected to a gate, a threshold voltage at the time of turning on the transistor can become smaller than that at the time of turning off the transistor, so that operation can be performed at a low voltage, which results in a decrease in a consumed power during operation. Meanwhile, the threshold voltage at the time of turning off the transistor is equal to that of a typical N-channel field effect transistor and a leakage current generated at the time of turning off the transistor becomes equal to that of a typical SRAM. The consumed power does not increase in a standby mode.

In addition, in JP-A-2000-22160, a method of controlling a substrate potential by means of gate and drain potentials by inserting an auxiliary transistor sharing a gate electrode with an MOS transistor between a drain terminal and a substrate terminal of the MOS transistor formed on a silicon-on-insulator (SOI) substrate has been disclosed. According to the method of inserting the auxiliary transistor, when the auxiliary transistor is turned on, a current flowing from the gate to the source is removed while a body potential becomes equal to the drain potential, so that advantages of the DTMOS field effect transistor can be achieved while preventing the consumed power from increasing due to the leakage current flowing from the gate to the source.

However, in the DTMOS field effect transistor, since the channel region is connected to the gate, a leakage current flows from the gate to the source when the transistor is turned on, so that the consumed power increases. In addition, in a short-channel SOI transistor, since the body region is narrow, a resistance between a body portion and a body terminal increases so as to increase an RC time constant, so that it is difficult to achieve high-speed operation.

Meanwhile, according to the method of inserting the auxiliary transistor, which shares the gate electrode with the MOS transistor, between the drain terminal and the substrate terminal of the MOS transistor in order to remove the leakage current flowing from the gate to the source, the number of transistors is doubled in a semiconductor memory device such as an SRAM or the like, which causes an element area to increase. In addition, the above-mentioned method cannot provide any solution for solving the problems associated with the high-speed operation of the short-channel SOI transistor.

SUMMARY

An advantage of some aspects of the invention is that it provides a semiconductor device capable of varying a threshold voltage without a leakage current flowing from a gate to a source and suppressing an element area from increasing, a semiconductor memory device, and a method of manufacturing a semiconductor device.

According to a first aspect of the invention, a semiconductor device includes: a first semiconductor layer that is formed on a first insulating layer; a second insulating layer that is formed on the first semiconductor layer; a second semiconductor layer that is formed on the second insulating layer; a gate electrode that is formed on the second semiconductor layer; source and drain layers that are formed in the second semiconductor layer and are arranged at sides of the gate electrode; and a first wiring layer that connects the gate electrode to the first semiconductor layer.

According to this aspect, the gate electrode can be connected to the first semiconductor layer insulated from a body region, a leakage current flowing from the gate electrode to the source layer can be removed, the first semiconductor layer can be capacitively coupled to the second semiconductor layer, and a potential of the semiconductor layer can vary in accordance with a potential of the gate electrode. Accordingly, the threshold voltage at the time of turning on the gate electrode can be smaller than that at the time of turning off the gate electrode, so that an on-current can increase to enable high-speed operation to be implemented, which results in a decrease in a consumed power during operation.

In addition, a threshold voltage at the time of turning off the gate electrode can be larger than that at the time of turning on the gate electrode, and a sub-threshold current can decrease. Accordingly, the leakage current at the time of turning off the gate electrode can decrease, which results in a decrease in a consumed power in a standby mode.

Preferably, the first semiconductor layer is element-isolated between transistors in which the gate electrode is formed.

Thereby, the threshold value can be individually controlled for each transistor, so that the consumed power can be further reduced.

Preferably, the semiconductor device includes: a first semiconductor layer formed on a first insulating layer; a second insulating layer formed on the first semiconductor layer; a second semiconductor layer formed on the second insulating layer; first and second gate electrodes formed on the second semiconductor layer; P-type source and drain layers formed in the second semiconductor layer and arranged at sides of the first gate electrode; N-type source and drain layers formed in the second semiconductor layer and arranged at sides of the second gate electrode; a first wiring layer connecting the first and second gate electrodes to the first semiconductor layer in common; and a second wiring layer connecting the P-type drain layer to the N-type drain layer.

Thereby, even when an inverter is formed in the second semiconductor layer, the threshold voltage can vary during operation while preventing the consumed power from increasing due to a leakage current flowing from the gate to the source, and high-speed switching operation can be achieved while suppressing the consumed power from increasing during operation. In addition, the first and second gate electrodes are commonly connected to the first semiconductor layer, so that the first semiconductor layer needs to be element-isolated. In addition, the element area can be reduced without adversely affecting operation of the inverter.

According to a second aspect of the invention, a semiconductor device includes: an insulating layer that is formed on a semiconductor substrate; a well that is formed in the semiconductor substrate; a semiconductor layer that is formed on the insulating layer; a gate electrode that is formed on the semiconductor layer; source and drain layers that are formed in the semiconductor layer and are arranged at sides of the gate electrode; and a wiring layer that connects the gate electrode to the well.

Thereby, the gate electrode can be connected to the well insulated from a body region and a leakage current flowing from the gate electrode to the source layer can be removed, and the well can be capacitively coupled to the semiconductor layer and a potential of the semiconductor layer can vary in accordance with a potential of the gate electrode. Accordingly, the threshold voltage can vary during operation while preventing the consumed power from increasing due to a leakage current flowing from the gate to the source, and high-speed switching operation can be achieved while suppressing the consumed power from increasing during operation.

According to a third aspect of the invention, a semiconductor memory device includes: a flip-flop circuit in which an input terminal of a first complementary metal oxide semiconductor (CMOS) inverter is connected to an output terminal of a second CMOS inverter and an output terminal of the first CMOS inverter is connected to an input terminal of the second CMOS inverter; a first transfer gate whose gate is connected to a word line, whose drain is connected to a first bit line, and whose source is connected to the output terminal of the first CMOS inverter; and a second transfer gate whose gate is connected to the word line, whose drain is connected to a second bit line, and whose source is connected to the output terminal of the second CMOS inverter. At least one of the first transfer gate and the second transfer gate includes: a first semiconductor layer that is formed on a first insulating layer; a second insulating layer that is formed on the first semiconductor layer; a second semiconductor layer that is formed on the second insulating layer; a gate electrode that is formed on the second semiconductor layer; source and drain layers that are formed on the second semiconductor layer and are arranged at sides of the gate electrode; and a wiring layer that connects the gate electrode to the first semiconductor layer.

Thereby, the leakage current flowing from the gate electrode to the source layer can be removed, the threshold voltage at the time of operating the transfer gate can decrease, and a potential drop resulted from switching between a low signal and high signal can decrease. Accordingly, a sufficient difference between the low signal and high signal can be achieved, which allows the semiconductor memory device to operate at a high speed.

According to fourth aspect of the invention, a method of manufacturing a semiconductor device includes: forming a second semiconductor layer on a first semiconductor layer laminated on a first insulating layer with a second insulating layer interposed therebetween; patterning the second semiconductor layer and the second insulating layer to expose a portion of the first semiconductor layer; subjecting the second semiconductor layer to a thermal oxidation process to form a gate insulating layer on a surface of the second semiconductor layer; forming a gate electrode on the gate insulating layer; forming source and drain layers arranged at sides of the gate electrode in the second semiconductor layer; and forming a wiring layer connecting the gate electrode to the first semiconductor layer.

Thereby, the gate electrode can be connected to the first semiconductor layer insulated from a body region, the SOI transistor can be formed in the second semiconductor layer, and the threshold voltage at the time of operating the SOI transistor can vary. Accordingly, it is impossible to prevent the consumed power from increasing due to a leakage current flowing from the gate to the source while the threshold voltage can vary during operation, and the consumed power can be suppressed from increasing during operation while high-speed switching operation can be achieved.

Preferably, the method of manufacturing a semiconductor device further includes: forming on the first semiconductor layer an element isolation insulating layer to element-isolate each transistor formed in the first semiconductor layer.

Thereby, a threshold value can be individually controlled for each transistor, so that the consumed power can be further reduced.

According to a fifth aspect of the invention, a method of manufacturing a semiconductor device includes: forming a plurality of laminated structures on a semiconductor substrate, each laminated structure having a first semiconductor layer and a second semiconductor layer laminated on the first semiconductor layer, the second semiconductor layer having a smaller etching rate than the first semiconductor layer; forming a step for exposing a surface of the second semiconductor layer of a lower layer while forming a first groove for exposing the semiconductor substrate by penetrating the first and second semiconductor layers; forming in the first groove a support for supporting the second semiconductor layer on the semiconductor substrate; forming a second groove for exposing at least a portion of the first semiconductor layer from the second semiconductor layer; selectively etching the first semiconductor layer through the second groove to remove the first semiconductor layer; subjecting the semiconductor substrate and the second semiconductor layer to thermal oxidation through the second groove to form an insulating layer arranged on a rear surface of the second semiconductor layer; subjecting the second semiconductor layer to thermal oxidation to form a gate insulating layer on the second semiconductor layer of the top layer; forming a gate electrode on the second semiconductor layer of the top layer with the gate insulating layer interposed therebetween; injecting ions using the gate electrode as a mask to form source and drain layers arranged at sides of the gate electrode in the second semiconductor layer of the top layer; and forming a wiring layer connecting the second semiconductor layer of the lower layer to the gate electrode.

Thereby, the thermal oxidation of the semiconductor layer allows a box layer to formed, and a crystalline quality of the semiconductor layer is not deteriorated and the SOI transistor can be formed. In addition, the threshold voltage at the time of operating the SOI transistor can vary. Accordingly, the threshold voltage can vary during operation while preventing the consumed power from increasing due to a leakage current flowing from the gate to the source, and high-speed switching operation can be achieved while the consumed power can be suppressed from increasing during operation.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a semiconductor device and a method of manufacturing the same according to a preferred embodiment of the invention will be described with reference to accompanying drawings.

Figure 1:
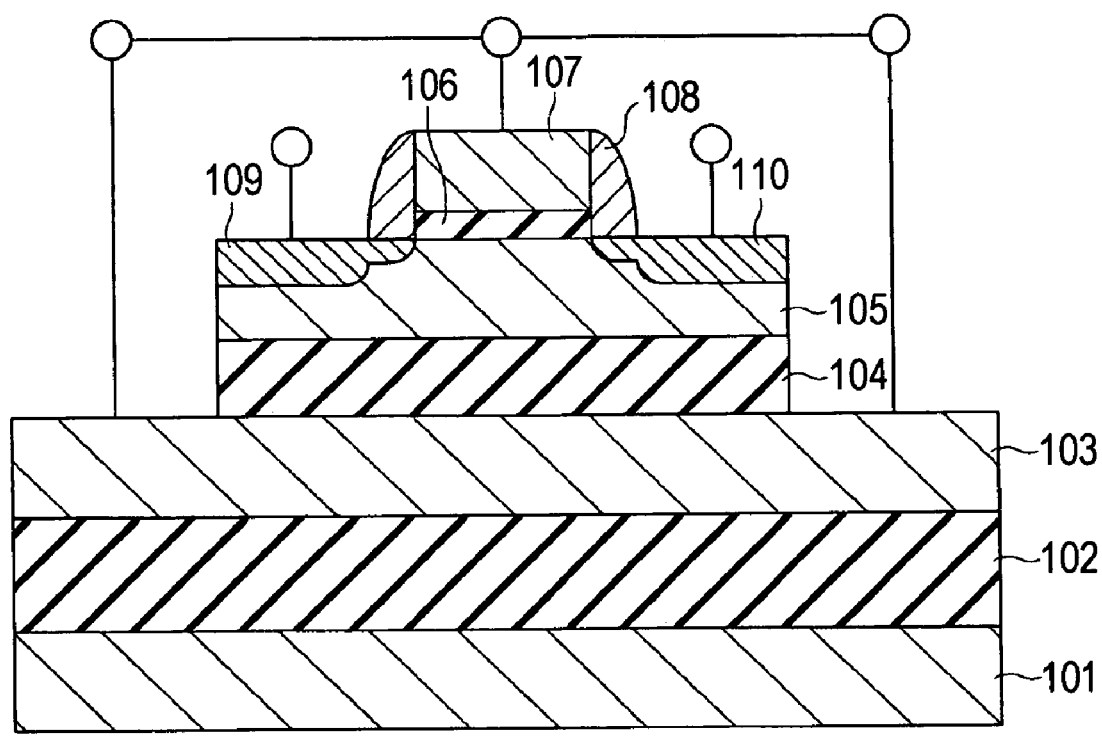
FIG. 1 is a cross-sectional view schematically illustrating a structure of a semiconductor device according to a first embodiment of the invention.

FIG. 1 is a cross-sectional view schematically illustrating a structure of a semiconductor device according to a first embodiment of the invention.

Referring to FIG. 1, an insulating layer 102 is formed on a semiconductor substrate 101, and a semiconductor layer 103 is formed on the insulating layer 102. In addition, an insulating layer 104 is formed on the semiconductor layer 103, and a semiconductor layer 105 is formed on the insulating layer 104. In this case, the insulating layer 104 and the semiconductor layer 105 can mesa-isolate the semiconductor layer 103 such that a portion of the semiconductor layer 103 is exposed to the insulating layer 104 and the semiconductor layer 105.

In addition, Si, Ge, SiGe, SiC, SiSn, PbS, GaAs, InP, GaP, GaN, ZnSe or the like may be used as a material for forming the semiconductor substrate 101 and the semiconductor layers 103 and 105, and an insulating layer such as $SiO_2$, SiON and $Si_3N_4$ or a buried insulating layer, or $\chi$-aluminum oxide layer ($\chi$-$Al_2O_3$ layer) may be used as a material for forming the insulating layers 102 and 104. In addition, an SOI substrate may be used as the semiconductor substrate 101 where the semiconductor layers 103 and 105 are formed on the corresponding insulating layers 102 and 104, respectively, and an SIMOX (separation by implanted oxygen) substrate, a laminated substrate, or a laser annealed substrate may be used as the SOI substrate. In addition, instead of the semiconductor substrate 101, an insulating substrate, which is formed of sapphire, glass, or ceramic, may be employed. In addition, besides a single crystalline semiconductor, a polycrystalline semiconductor or an amorphous semiconductor may be employed for the semiconductor layers 103 and 105. In addition, a metal having a high melting point such as W or Mo may be, employed instead of the semiconductor layer 103.

A gate electrode 107 is formed on the semiconductor layer 105 with the gate insulating layer 106 interposed therebetween, and side walls 108 are formed at sides of the gate electrode 107. A source layer 109 is formed in the semiconductor layer 105 via a lightly doped drain (LDD) layer at one side of the gate electrode 107, and a drain layer 110 is formed in the semiconductor layer 105 via the LDD layer at the other side of the gate electrode 107. Further, the gate electrode 107 is connected to the semiconductor layer 103 via a wiring layer.

When the gate electrode 107 is turned on, a potential of the semiconductor layer 103 increases, so that the potential of the semiconductor layer 103 is transmitted to the semiconductor layer 105 thorough the insulating layer 104. As a result, when the gate electrode 107 is turned on, the potential of the semiconductor layer 105 increases, so that a threshold voltage decreases in a case of an N-channel field effect transistor. In this case, the semiconductor layers 103 and 105 are insulated from each other by means of the insulating layer 104, so that it is possible to prevent a leakage current from flowing from the gate electrode 107 to the source layer 109 even when the gate electrode 107 is turned on. Accordingly, as compared with a case in which the gate electrode 107 is not connected to the semiconductor layer 103, an on current can increase, and high speed operation can be achieved, and it is possible to prevent a consumed power from increasing due to the leakage current flowing from the gate electrode 107 to the source layer 109.

In addition, when the gate electrode 107 is turned off, a potential of the semiconductor layer 103 decreases, so that the potential of the semiconductor layer 103 is transmitted to the semiconductor layer 105 through the insulating layer 104. As a result, when the gate electrode 107 is turned off, a potential of the semiconductor layer 105 decreases, so that a threshold voltage increases in a case of an N-channel field effect transistor. Accordingly, a sub-threshold current can decrease, and the leakage current when the gate electrode 107 is turned off can decrease, so that a consumed power can decrease in a standby mode.

Figure 2:
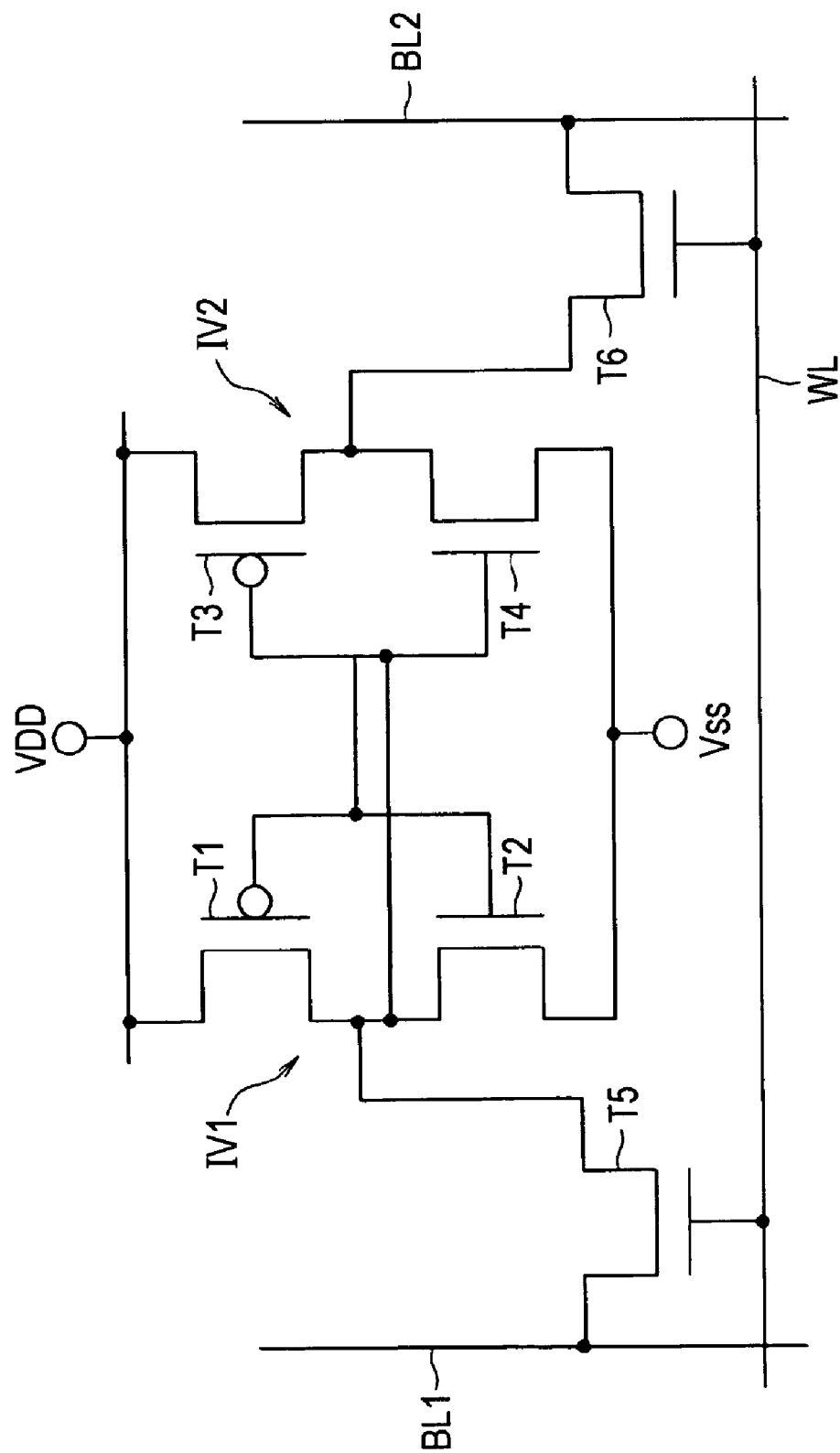
FIG. 2 is a circuit diagram schematically illustrating a structure of a semiconductor memory device according to a second embodiment of the invention.

FIG. 2 is a circuit diagram schematically illustrating a structure of a semiconductor memory device according to a second embodiment of the invention.

Referring to FIG. 2, P-channel field effect transistors T1 and T3 and N-channel field effect transistors T2, T4, T5, and T6 are provided in the semiconductor memory device, thereby constituting an SRAM. In this case, the P-channel field effect transistor T1 and the N-channel field effect transistor T2 are connected in series to each other and gates of the P-channel field effect transistor T1 and the N-channel field effect transistor T2 are commonly connected, thereby constituting a CMOS inverter IV1. In addition, the P-channel field effect transistor T3 and the N-channel field effect transistor T4 are connected in series to each other and gates of the P-channel field effect transistor T3 and the N-channel field effect transistor T4 are commonly connected, thereby constituting a CMOS inverter IV2.

Further, an input terminal of the CMOS inverter IV1 is connected to an output terminal of the CMOS inverter IV2 while an output terminal of the CMOS inverter IV1 is connected to an input terminal of the CMOS inverter IV2, thereby constituting a flip-flop circuit. That is, gates of the P-channel field effect transistor T1 and the N-channel field effect transistor T2 are connected to the drains of the P-channel field effect transistor T3 and the N-channel field effect transistor T4, and drains of the P-channel field effect transistor T1 and the N-channel field effect transistor T2 are connected to the gates of the P-channel field effect transistor T3 and the N-channel field effect transistor T4.

In addition, each of the N-channel field effect transistors T5 and T6 constitutes a transfer gate, and a structure shown in FIG. 1 may be used as a structure of each of the N-channel field effect transistors T5 and T6. Further, in the N-channel field effect transistor T5, the gate is connected to a word line WL, the drain is connected to a bit line BL1, and the source is connected to the output terminal of the CMOS inverter IV1. In addition, in the N-channel field effect transistor T6, the gate is connected to the word line WL, the drain is connected to a bit line BL2, and the source is connected to the output terminal of the CMOS inverter IV2.

When a logical value '1' is written in the semiconductor memory device of FIG. 2, the bit line BL1 is set to a high level, the bit line BL2 is set to a low level, and the word line WL is set to a high level. As a result, the N-channel field effect transistors T5 and T6 are turned on, so that the level of the bit line BL1 is transmitted to the output terminal of the CMOS inverter IV1 and the input terminal of the CMOS inverter IV2 and the level of the bit line BL2 is transmitted to the input terminal of the CMOS inverter IV1 and the output terminal of the CMOS inverter IV2. Accordingly, the output terminal of the CMOS inverter IV1 and the input terminal of the CMOS inverter IV2 become high levels while the input terminal of the CMOS inverter IV1 and the output terminal of the CMOS inverter IV2 become low levels, and the logical value of the CMOS inverter IV1 becomes '1' while the logical value of the CMOS inverter IV2 becomes '0'. Further, when the logical value of the CMOS inverter IV1 becomes '1' and the logical value of the CMOS inverter IV2 becomes '0', the P-channel field effect transistor T1 and the N-channel field effect transistor T4 are turned on while the P-channel field effect transistor T3 and the N-channel field effect transistor T2 are turned off, so that the output terminal of the CMOS inverter IV1 and the input terminal of the CMOS inverter IV2 are connected to a VDD potential while the input terminal of the CMOS inverter IV1 and the output terminal of the CMOS inverter IV2 are connected to a VSS potential. Accordingly, if the logical value of the CMOS inverter IV1 becomes '1' and the logical value of the CMOS inverter IV2 becomes '0', in a case in which the word line WL is set to a low level to interrupt the signals of the CMOS inverters IV1 and IV2 transmitted from the bit lines BL1 and BL2, respectively, the output terminal of the CMOS inverter IV1 maintains a high level and the output terminal of the CMOS inverter IV2 maintain a low level. As a result, the logical value '1' can be stored in the semiconductor memory device.

In addition, when a logical value '0' is written in the semiconductor memory device of FIG. 2, the bit line BL1 is set to a low level while the bit line BL2 is set to a high level, and the word line WL is set to a high level. As a result, the N-channel field effect transistors T5 and T6 are turned on, so that the level of the bit line BL1 is transmitted to the output terminal of the CMOS inverter IV1 and the input terminal of the CMOS inverter IV2 while the level of the bit line BL2 is transmitted to the input terminal of the CMOS inverter IV1 and the output terminal of the CMOS inverter IV2. Accordingly, the output terminal of the CMOS inverter IV1 and the input terminal of the CMOS inverter IV2 become low levels while the input terminal of the CMOS inverter IV1 and the output terminal of the CMOS inverter IV2 become high levels, and the logical value of the CMOS inverter IV1 becomes '0' while the logical value of the CMOS inverter IV2 becomes '1'. Further, when the logical value of the CMOS inverter IV1 becomes '0' and the logical value of the CMOS inverter IV2 becomes '1', the P-channel field effect transistor T1 and the N-channel field effect transistor T4 are turned off while the P-channel field effect transistor T3 and the N-channel field effect transistor T2 are turned on, so that the output terminal of the CMOS inverter IV1 and the input terminal of the CMOS inverter IV2 are connected to a VSS potential while this reason, if the logical value of the CMOS inverter IV1 becomes '0' and the logical value of the CMOS inverter IV2 becomes '1', even in a case in which the word line WL is set to a low level to interrupt the signals of the CMOS inverters IV1 and IV2 transmitted from the bit lines BL1 and BL2, respectively, the output terminal of the CMOS inverter IV1 maintains a low level while the output terminal of the CMOS inverter IV2 maintains a high level, so that the logical value '0' can be stored in the semiconductor memory device.

Meanwhile, when the semiconductor memory device of FIG. 2 is read, the bit lines BL1 and BL2 are opened and the word line WL becomes a high level. In this case, the N-channel field effect transistors T5 and T6 are turned on, so that the level of the bit line BL1 becomes substantially equal to the level of the output terminal of the CMOS inverter IV1 while the level of the bit line BL2 becomes substantially equal to the level of the output terminal of the CMOS inverter IV2. As a result, it is possible to read logical values stored in the semiconductor memory device through the bit lines BL1 and BL2.

In this case, the structure of FIG. 1 is used as the structure of each of the N-channel field effect transistors T5 and T6, so that the threshold voltage when the N-channel field effect transistors T5 and T6 are operated can decrease without the leakage current flowing from the gate electrode to the source layer, which results in a decrease of a potential drop generated when rewriting is performed at a level between a low signal and a high signal. Accordingly, a sufficient difference between the low signal and high signal can be achieved, so that the semiconductor memory device can be stably operated at a high speed.

Figure 3:
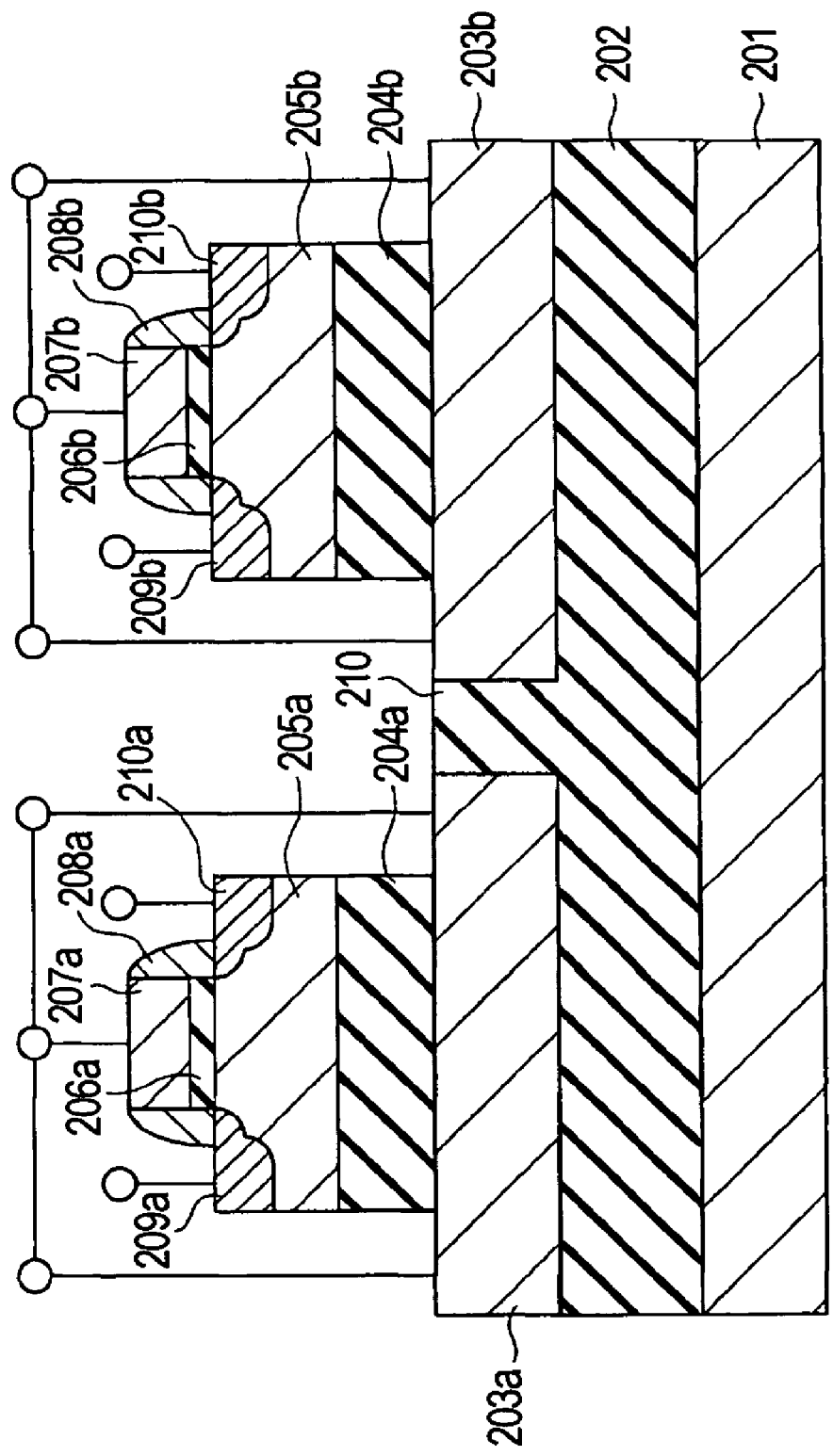
FIG. 3 is a cross-sectional view schematically illustrating a structure of a semiconductor device according to a third embodiment of the invention.

FIG. 3 is a cross-sectional view schematically illustrating a structure of a semiconductor device according to a third embodiment of the invention.

Referring to FIG. 3, an insulating layer 202 is formed on a semiconductor substrate 201, and semiconductor layers 203a and 203b are formed on the insulating layer 202. In this case, the semiconductor layers 203a and 203b are isolated from each other through an element isolation layer 210. In addition, a method of isolating the semiconductor layers 203a and 203b may include an LOCOS (local oxidation of silicon) method, an STI (shallow trench isolation) method or the like. In addition, insulating layers 204a and 204b are respectively formed on the semiconductor layers 203a and 203b, and semiconductor layers 205a and 205b are respectively formed on the insulating layers 204a and 204b. In this case, the insulating layers 204a and 204b, and the semiconductor layers 205a and 205b can mesa-isolate the semiconductor layers 203a and 203b such that portions of the semiconductor layers 203a and 203b are exposed to the insulating layers 204a and 204b and the semiconductor layers 205a and 205b, respectively.

A gate electrode 207a is formed on the semiconductor layer 205a with the gate insulating layer 206a interposed therebetween and a gate electrode 207b is formed on the semiconductor layer 205b with the gate insulating layer 206b interposed therebetween. Side walls 208a are formed at sides of the gate electrode 207a and side walls 208b are formed at sides of the gate electrode 207b. At one side of the gate electrode 207a, a source layer 209a is formed in the semiconductor layer 205a via an LDD layer, and at one side of the gate electrode 207b, a source layer 209b is formed in the semiconductor layer 205b via an LDD layer. Further, at the other side of the gate electrode 207a, a drain layer 210a is formed in the semiconductor layer 205a via an LDD layer, and at the other side of the gate electrode 207b, a drain layer 210b is formed in the semiconductor layer 205b via an LDD layer. Furthermore, the gate electrodes 207a and 207b are connected to the semiconductor layers 203a and 203b through a wiring layer, respectively.

Accordingly, the gate electrodes 207a and 207b can be respectively connected to the semiconductor layers 203a and 203b insulated from a body region, and a leakage current respectively flowing from the gate electrodes 207a and 207b to the source layers 209a and 209b can be removed. In addition, the semiconductor layers 203a and 203b can be capacitively coupled with the semiconductor layers 205a and 205b, so that potentials of the semiconductor layers 205a and 205b can vary in accordance with potentials of the gate electrodes 207a and 207b, respectively. For this reason, a threshold voltage at the time of turning on the gate electrodes 207a and 207b can be made to be lower than that at the time of turning off the gate electrodes 207a and 207b, an on-current can be increased to enable high speed operation to be performed, and a consumed power can be decreased during operation.

In addition, the threshold voltage at the time of turning off the gate electrodes 207a and 207b can be made to be larger than that at the time of turning on the gate electrodes 207a and 207b, so that a sub-threshold current can decrease. Accordingly, a leakage current at the time of turning off the gate electrodes 207a and 207b can decrease, which results in a decrease in the consumed power in a standby mode. In addition, the semiconductor layers 203a and 203b are isolated from each other by the element isolation layer 210, so that the threshold value can be individually controlled for each transistor where the gate electrodes 207a and 207b are provided, which results in a decrease in the consumed power.

Figure 4:
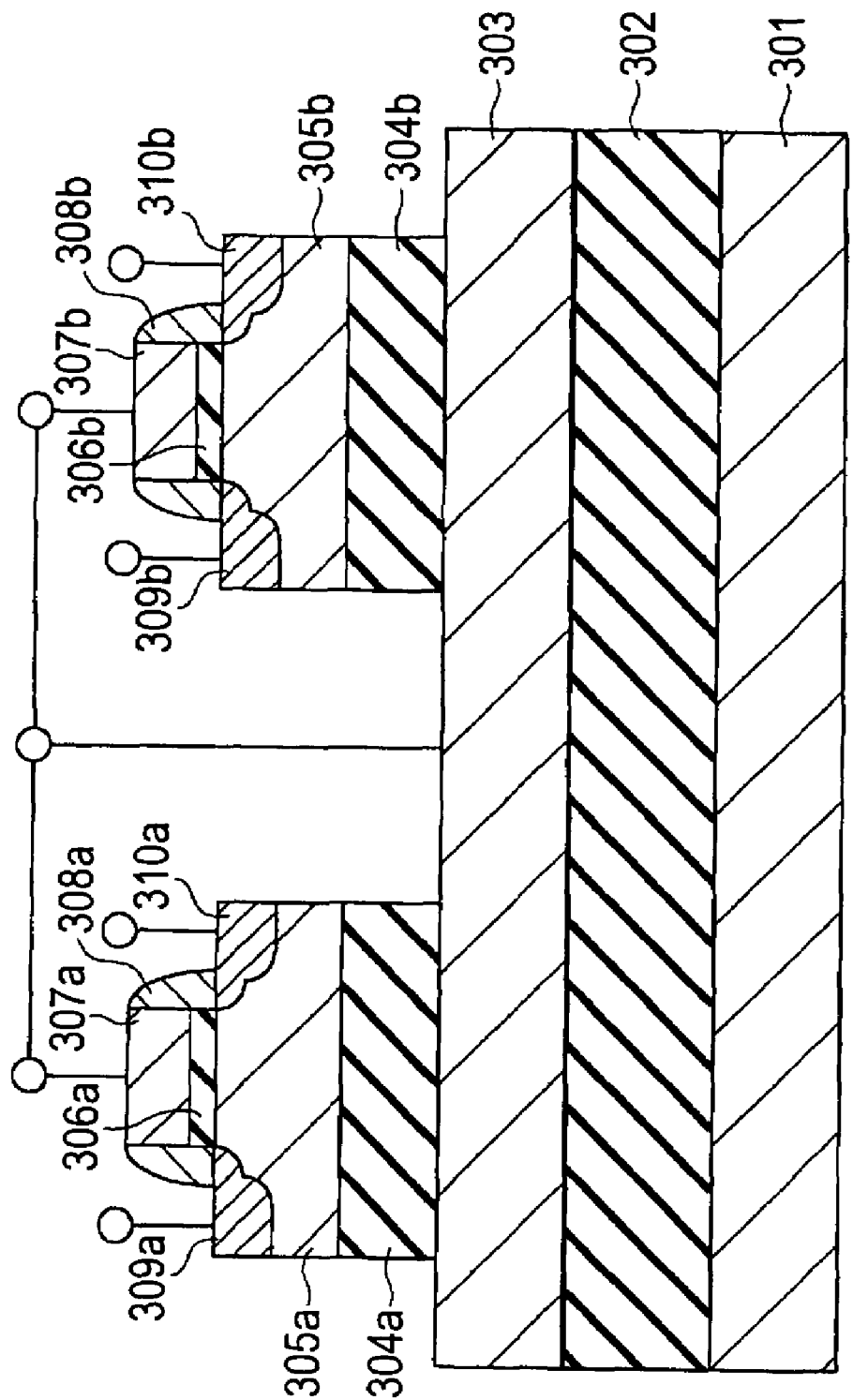
FIG. 4 is a cross-sectional view schematically illustrating a structure of a semiconductor device according to a fourth embodiment of the invention.

FIG. 4 is a cross-sectional view schematically illustrating a structure of a semiconductor device according to a fourth embodiment of the invention.

Referring to FIG. 4, an insulating layer 302 is formed on a semiconductor substrate 301, and a semiconductor layer 303 is formed on the insulating layer 302. In addition, insulating layers 304a and 304b are formed on the semiconductor layer 303, and semiconductor layers 305a and 305b are formed on the insulating layers 304a and 304b, respectively. In this case, the insulating layers 304a and 304b and the semiconductor layers 305a and 305b can mesa-isolate the semiconductor layer 303 such that portions of the semiconductor layer 303 are exposed to the insulating layers 304a and 304b and the semiconductor layers 305a and 305b.

Further, a gate electrode 307a is formed on the semiconductor layer 305a with a gate insulating layer 306a interposed therebetween and a gate electrode 307b is formed on the semiconductor layer 305b with a gate insulating layer 306b interposed therebetween. Side walls 308a are formed at sides of the gate electrode 307a and side walls 308b are formed at sides of the gate electrode 307b. In addition, a P-type source layer 309a is formed in the semiconductor layer 305a via an LDD layer at one side of the gate electrode 307a, and a P-type drain layer 310a is formed in the semiconductor layer 305a via an LDD layer at the other side of the gate electrode 307a. In addition, an N-type source layer 309b is formed in the semiconductor layer 305b via an LDD layer at one side of the gate electrode 307b, and an N-type drain layer 310b is formed in the semiconductor layer 305b via an LDD layer at the other side of the gate electrode 307b. Further, the gate electrodes 307a and 307b are commonly connected to the semiconductor layer 303 through a wiring layer.

Thereby, even when a CMOS inverter is formed in the semiconductor layers 305a and 305b, it is possible to prevent a consumed power from increasing due to a leakage current respectively flowing from the gate electrodes 307a and 307b to the P-type source layer 309a and the N-type source layer 309b, and the threshold voltage can vary during operation. Therefore, high-speed operation can be achieved while preventing the consumed power from increasing during operation. In addition, the gate electrodes 307a and 307b are commonly connected to the semiconductor layer 303, so that the semiconductor layer 303 needs not to be isolated, which results in a decrease in an element area without adversely affecting the operation of the CMOS inverter.

Figure 5:
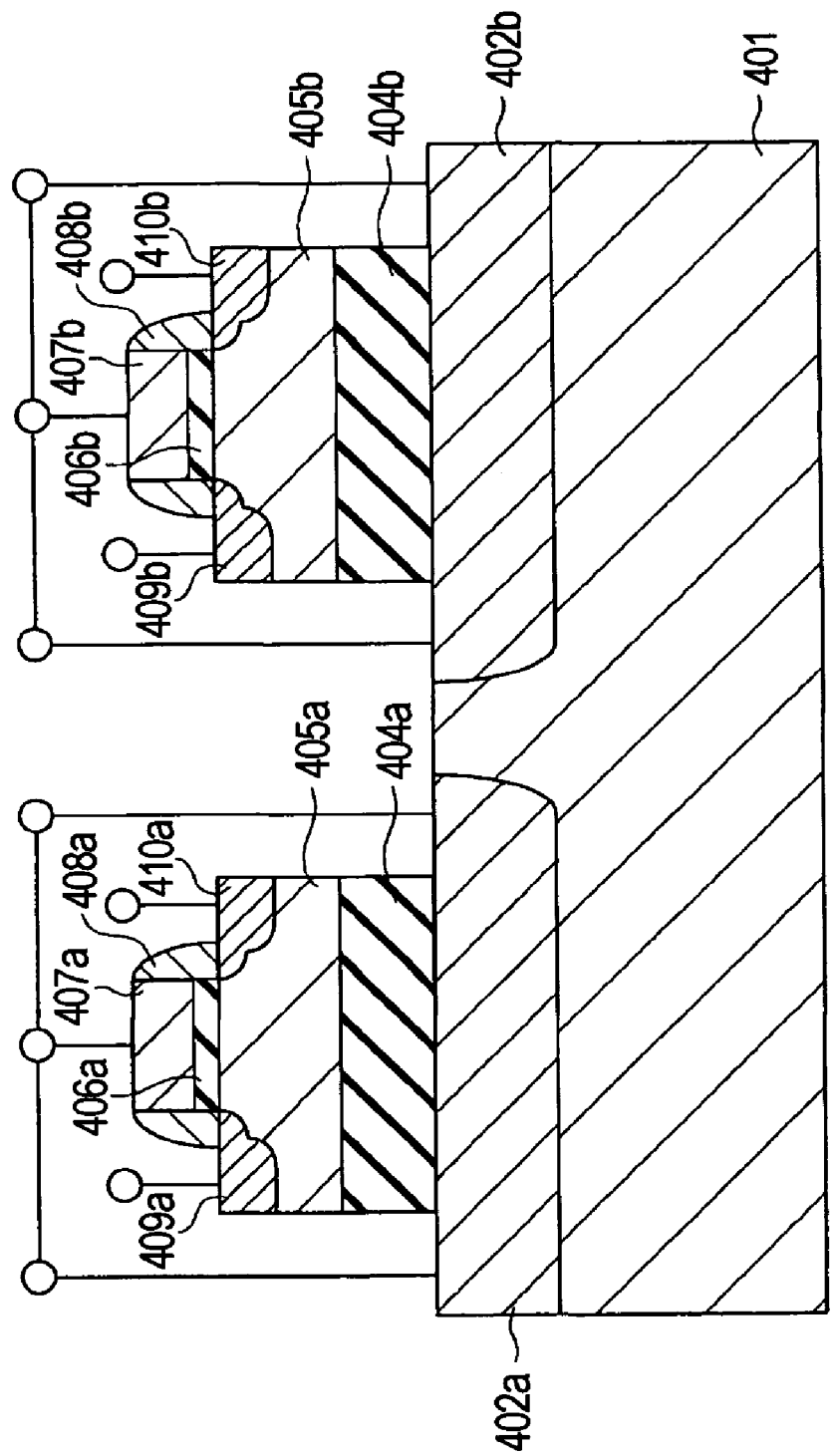
FIG. 5 is a cross-sectional view schematically illustrating a structure of a semiconductor device according to a fifth embodiment of the invention.
Figure 6A:
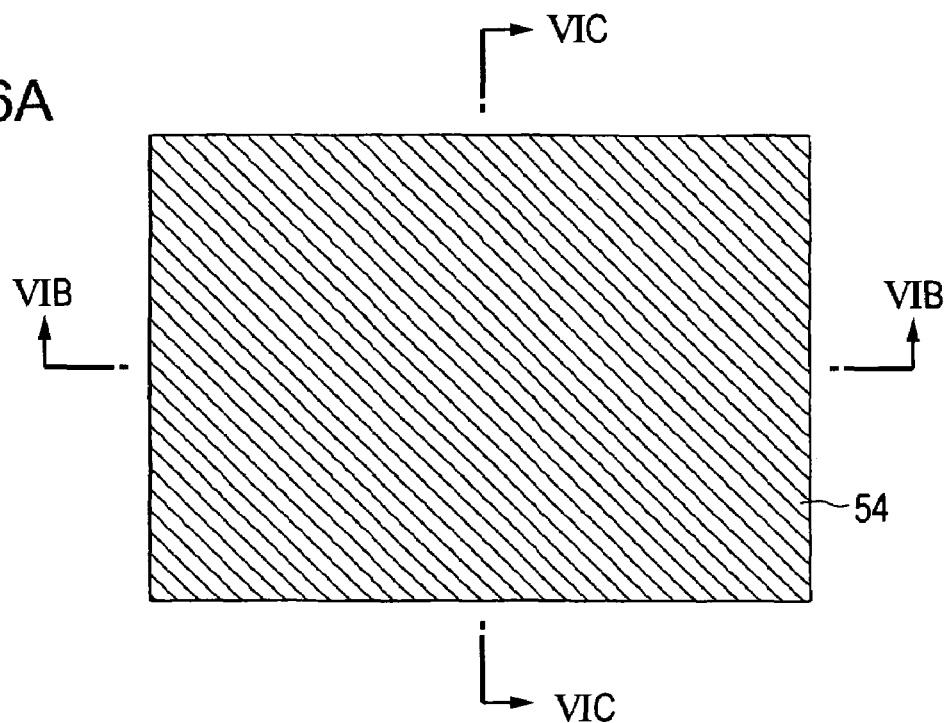
FIG. 6 is a cross-sectional view illustrating a method of manufacturing a semiconductor device according to a sixth embodiment of the invention.
Figure 6B:
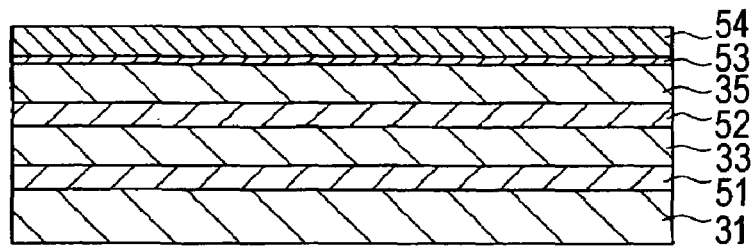
Figure 6C:
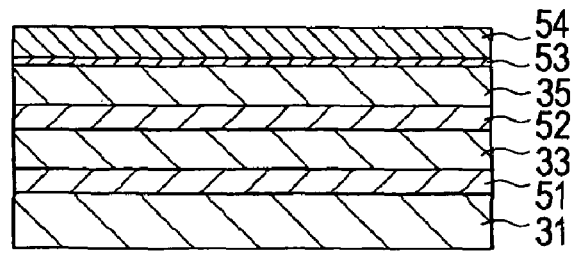
Figure 7A:
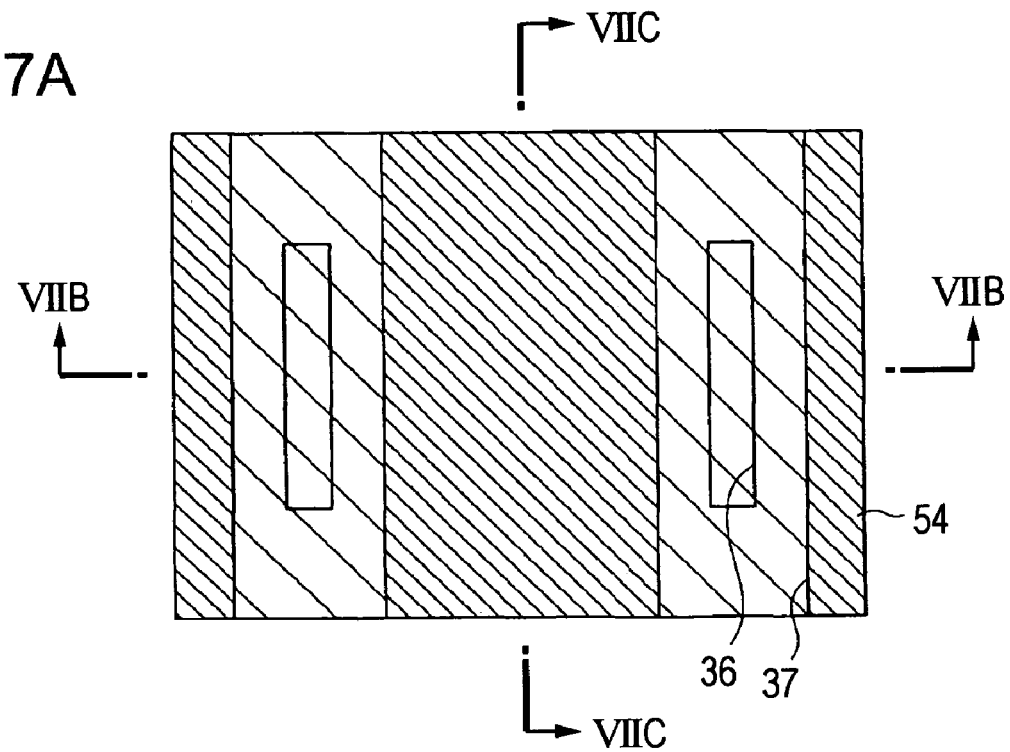
FIG. 7 is a cross-sectional view illustrating a method of manufacturing the semiconductor device according to the sixth embodiment of the invention.
Figure 7B:
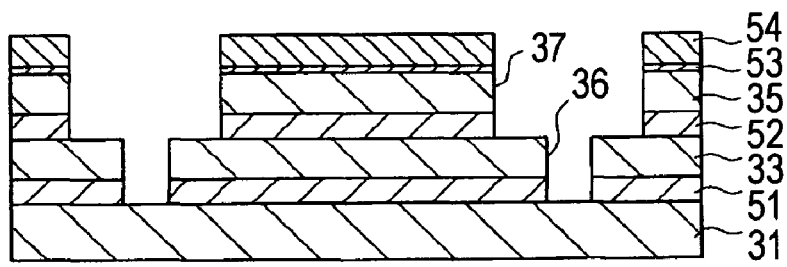
Figure 7C:
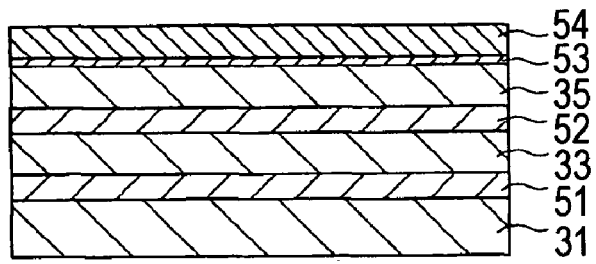
Figure 8A:
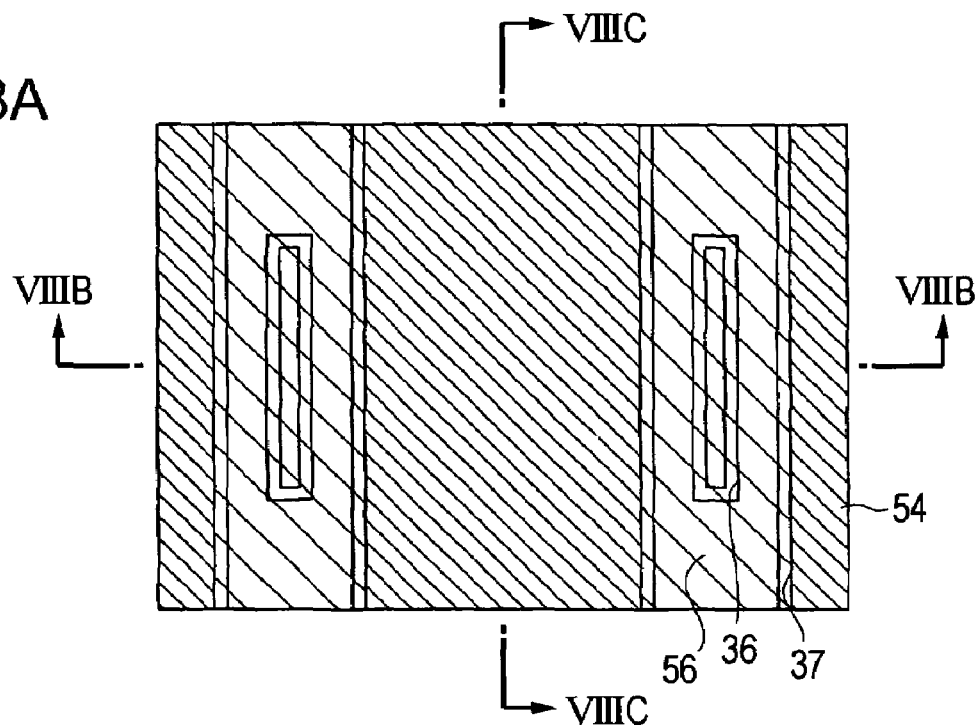
FIG. 8 is a cross-sectional view illustrating a method of manufacturing the semiconductor device according to the sixth embodiment of the invention.
Figure 8B:
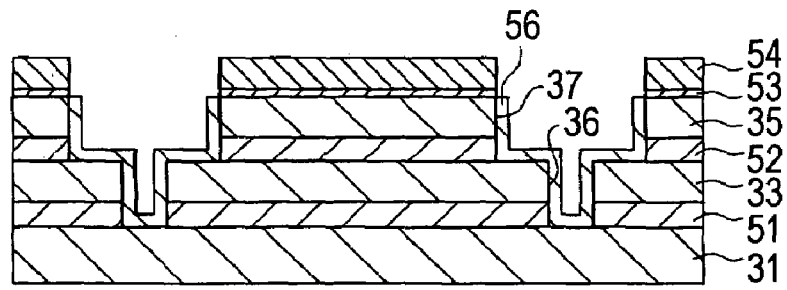
Figure 8C:
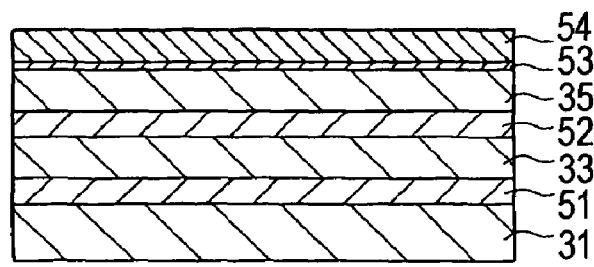
Figure 9A:
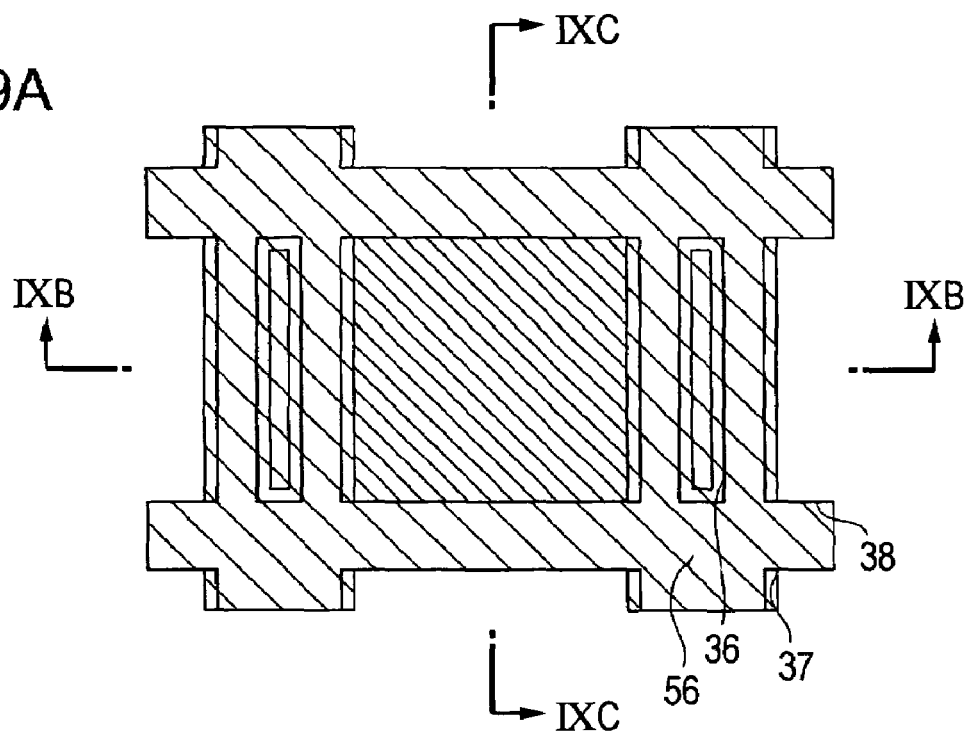
FIG. 9 is a cross-sectional view illustrating a method of manufacturing the semiconductor device according to the sixth embodiment of the invention.
Figure 9B:
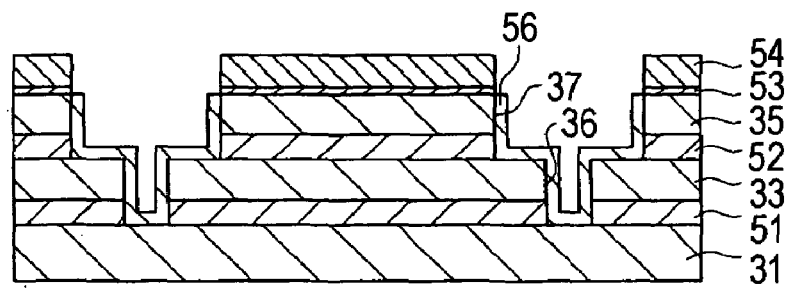
Figure 9C:
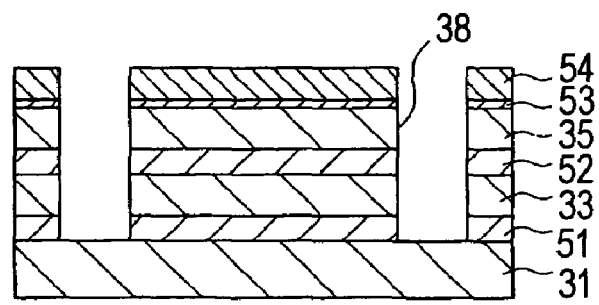
Figure 10A:
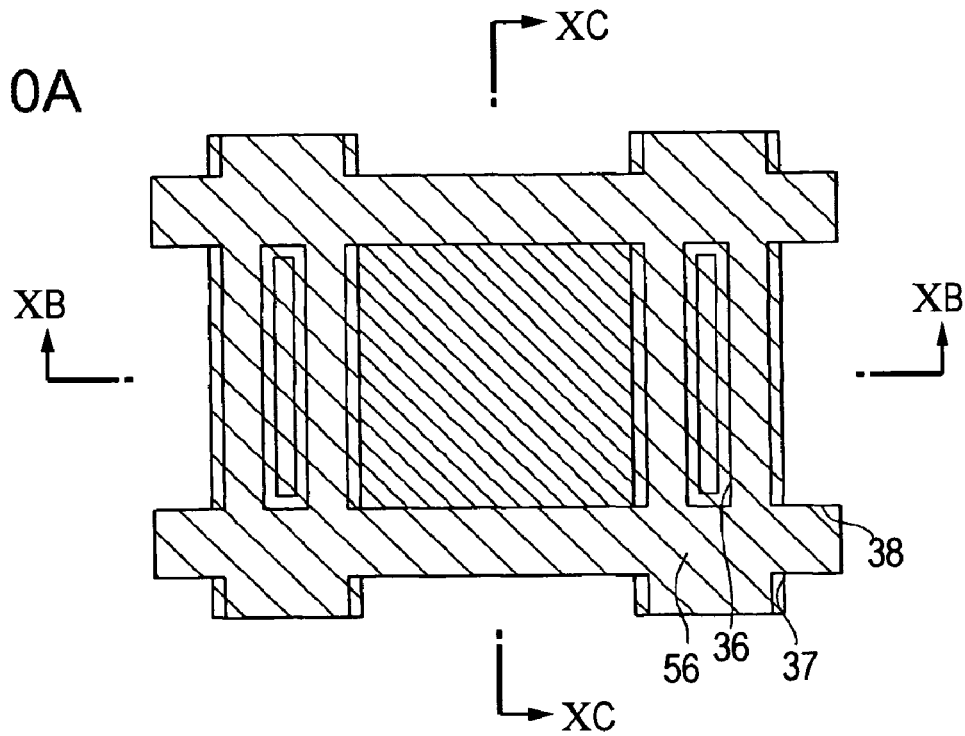
FIG. 10 is a cross-sectional view illustrating a method of manufacturing the semiconductor device according to the sixth embodiment of the invention.
Figure 10B:
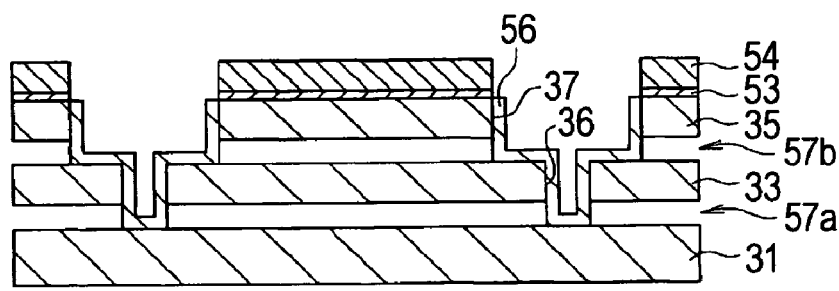
Figure 10C:
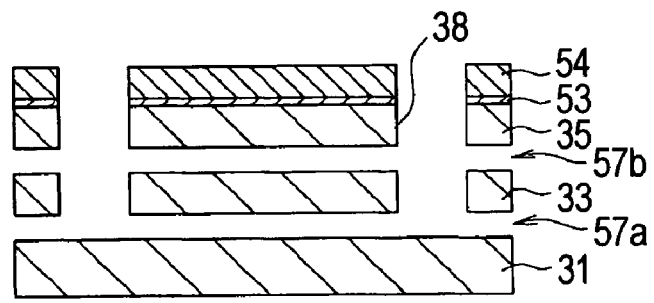
Figure 11A:
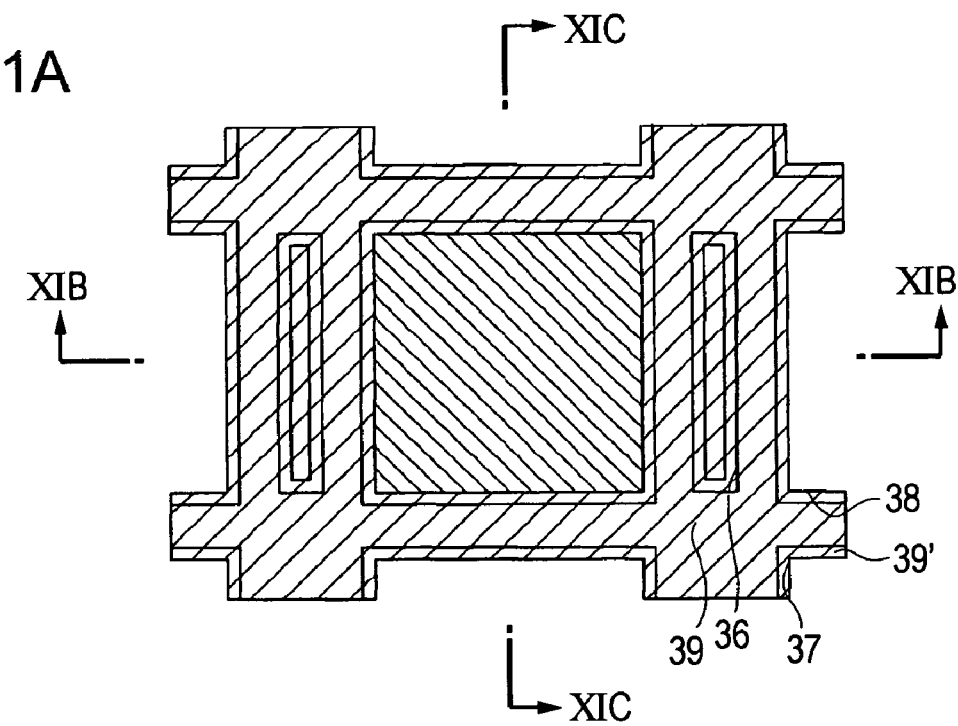
FIG. 11 is a cross-sectional view illustrating a method of manufacturing the semiconductor device according to the sixth embodiment of the invention.
Figure 11B:
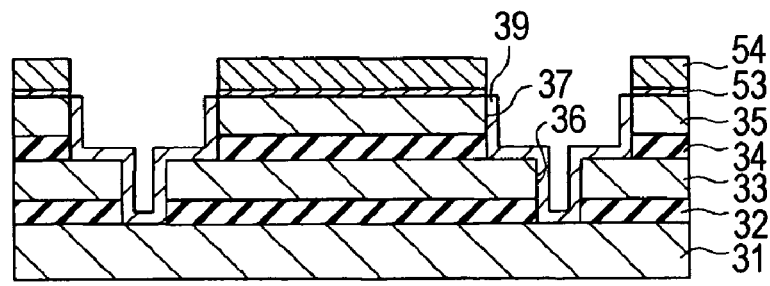
Figure 11C:
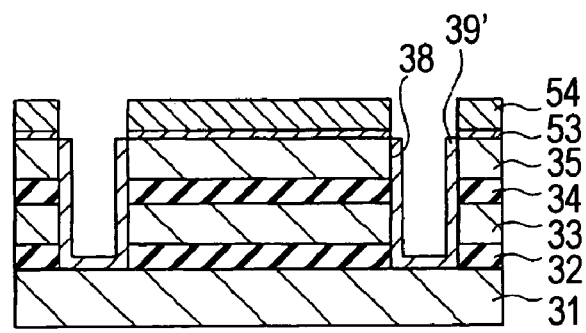
Figure 12A:
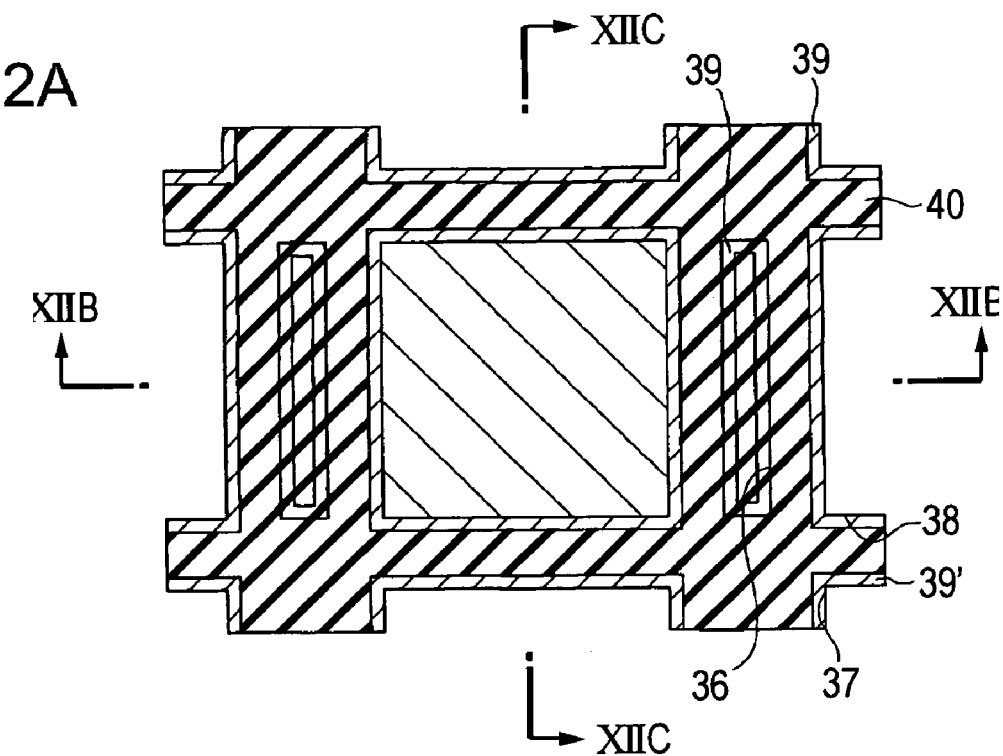
FIG. 12 is a cross-sectional view illustrating a method of manufacturing the semiconductor device according to the sixth embodiment of the invention.
Figure 12B:
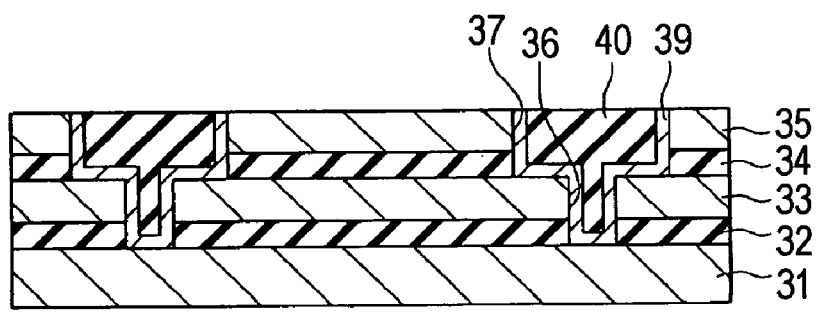
Figure 12C:
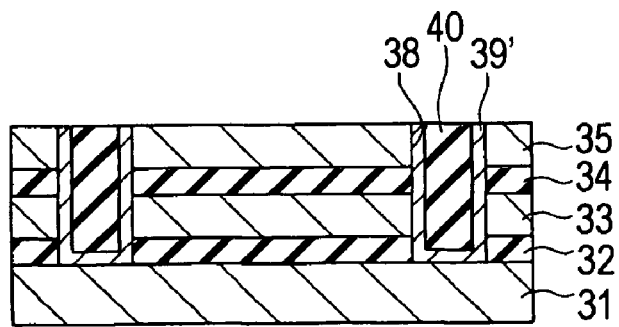
Figure 13A:
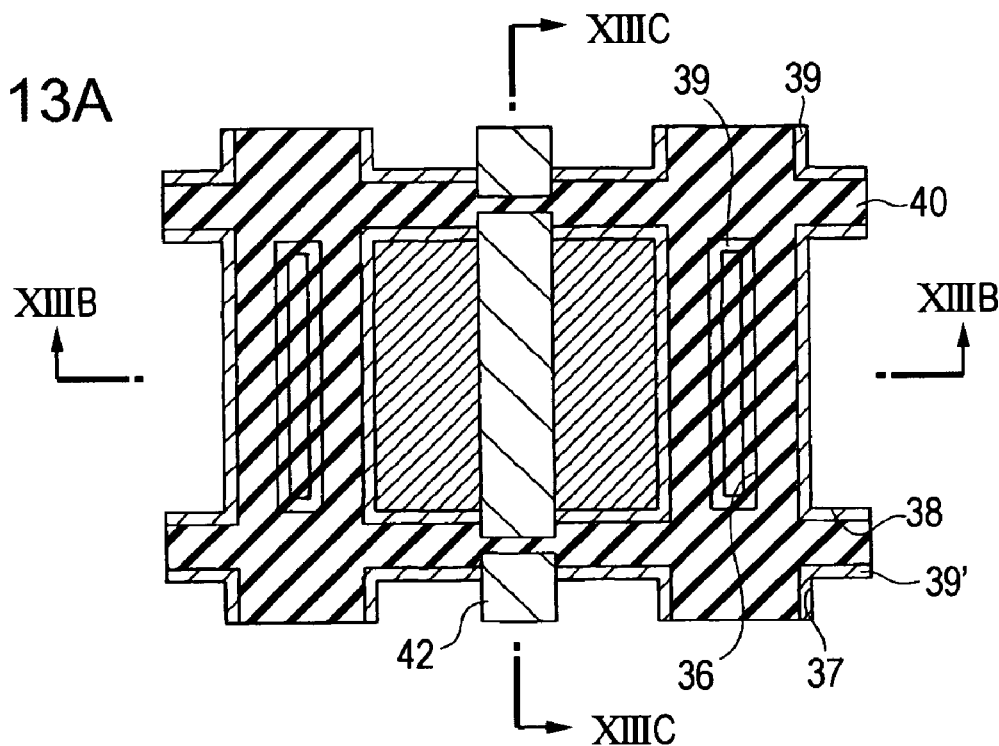
FIG. 13 is a cross-sectional view illustrating a method of manufacturing the semiconductor device according to the sixth embodiment of the invention.
Figure 13B:
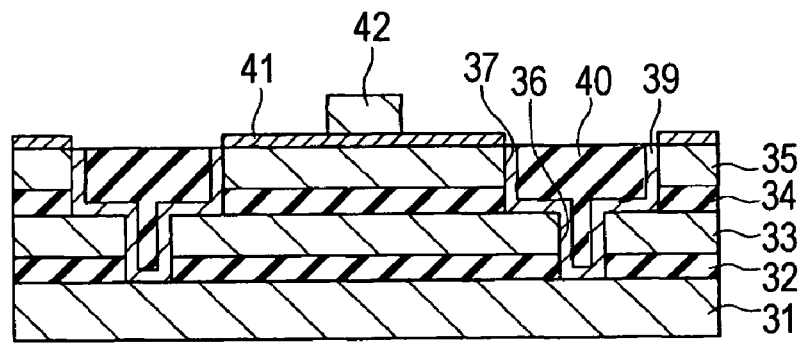
Figure 13C:
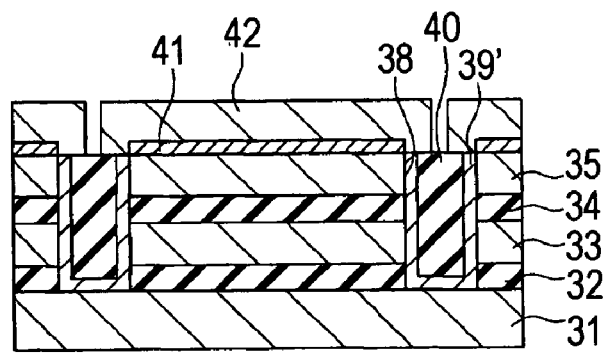
Figure 14A:
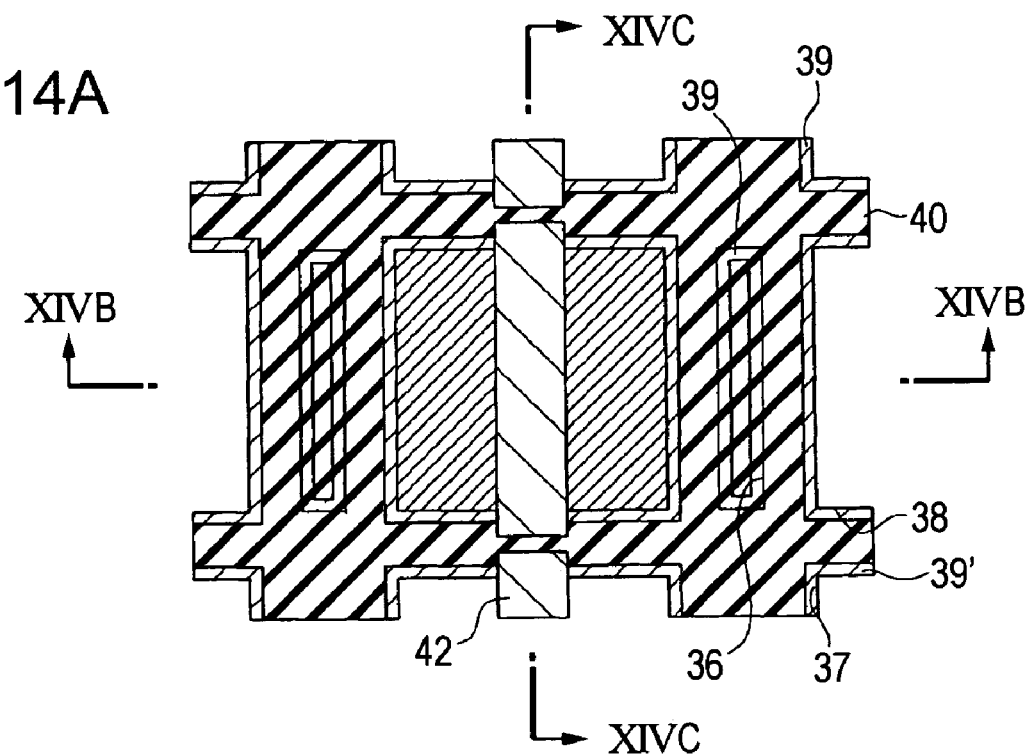
FIG. 14 is a cross-sectional view illustrating a method of manufacturing the semiconductor device according to the sixth embodiment of the invention.
Figure 14B:
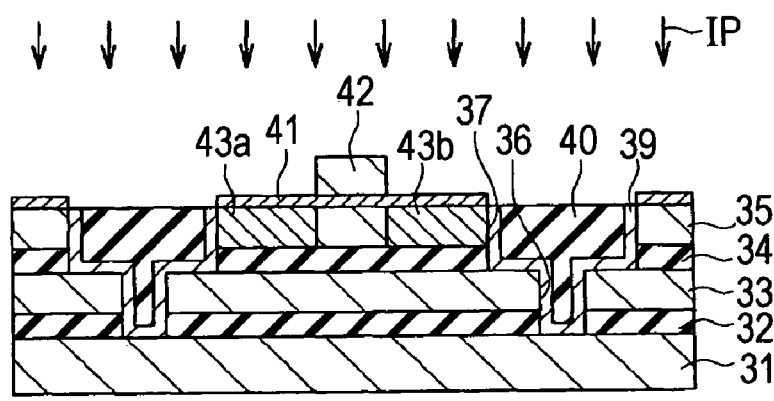
Figure 14C:
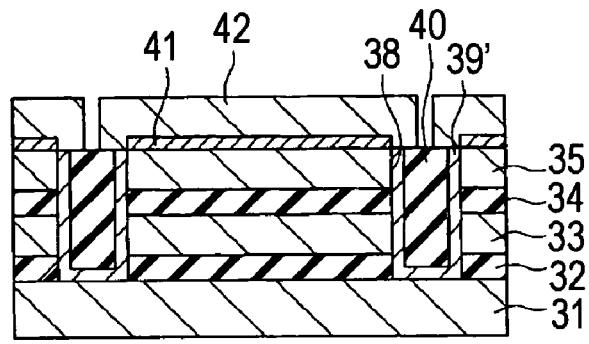
Figure 15A:
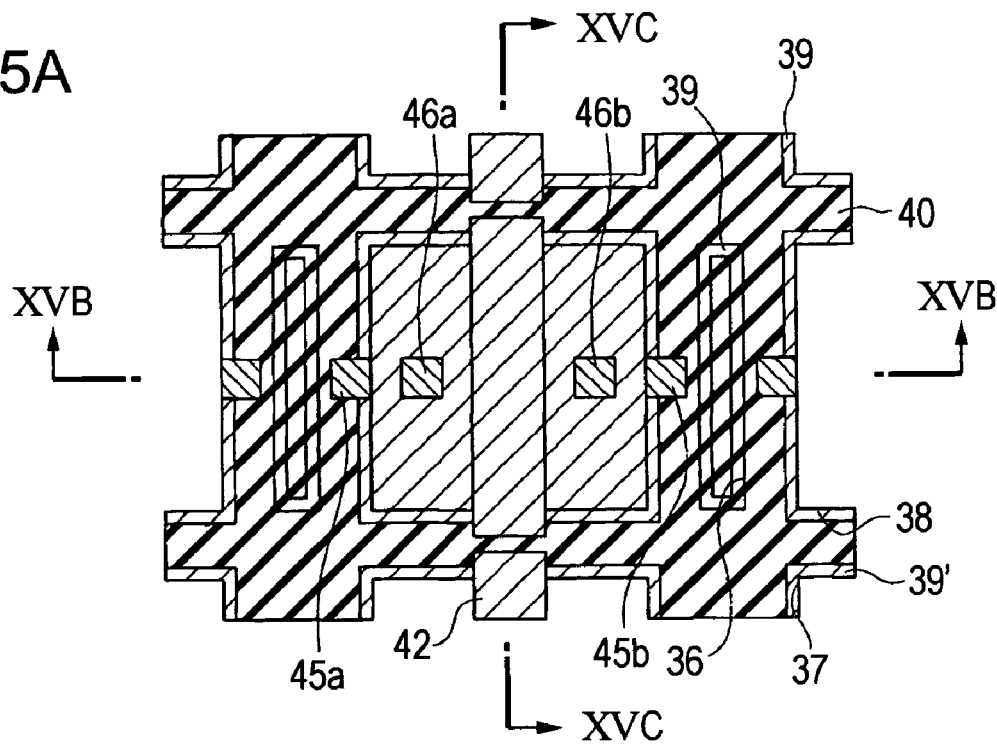
FIG. 15 is a cross-sectional view illustrating a method of manufacturing the semiconductor device according to the sixth embodiment of the invention.
Figure 15B:
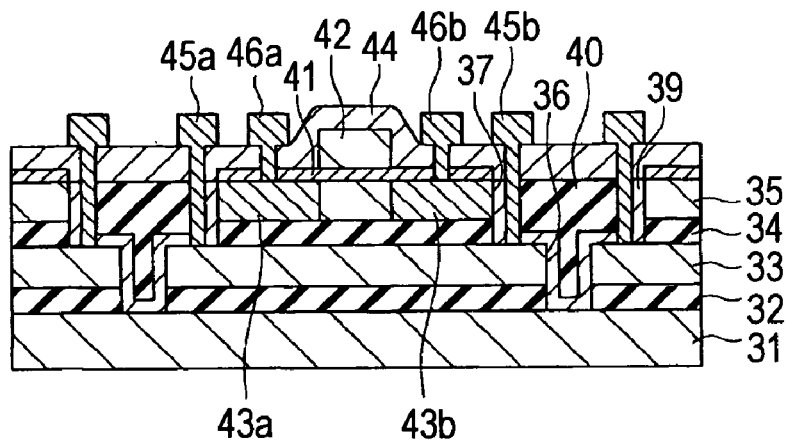
Figure 15C:
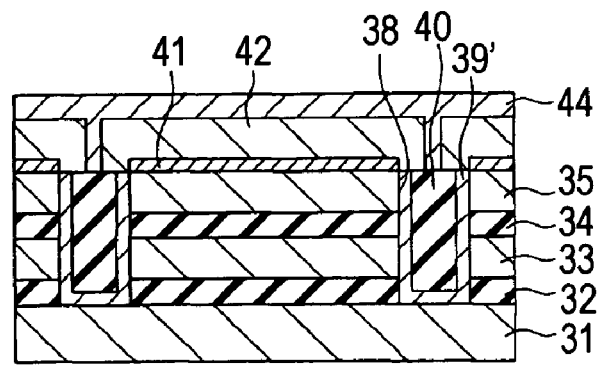
Figure 16A:
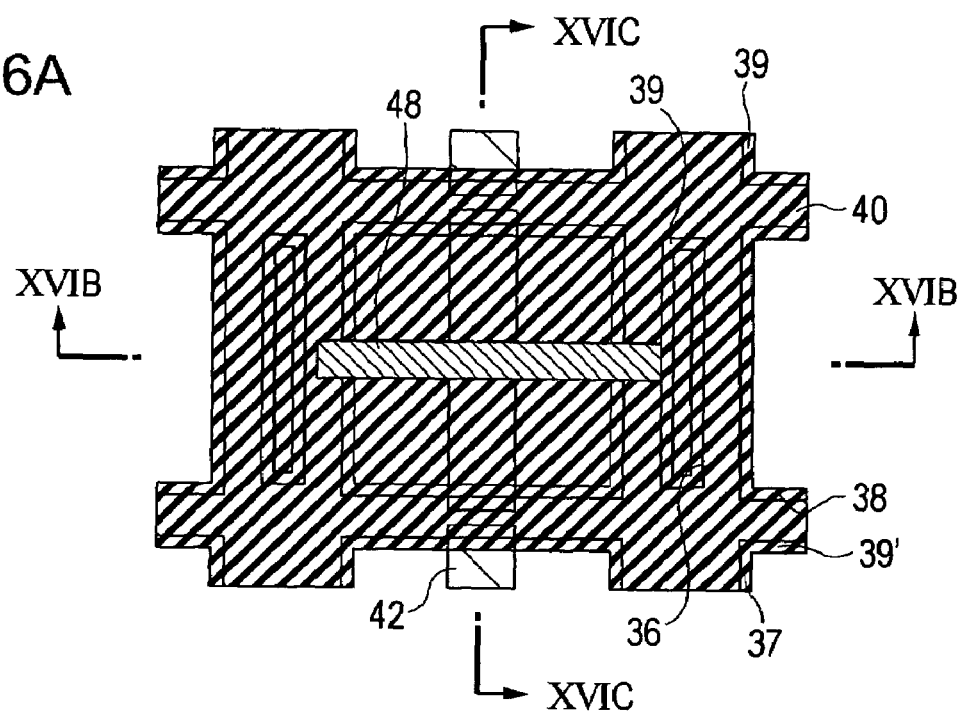
FIG. 16 is a cross-sectional view illustrating a method of manufacturing the semiconductor device according to the sixth embodiment of the invention.
Figure 16B:
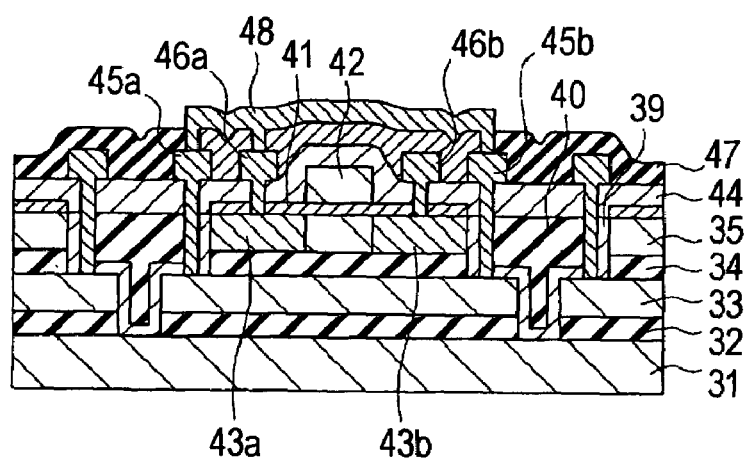
Figure 16C:
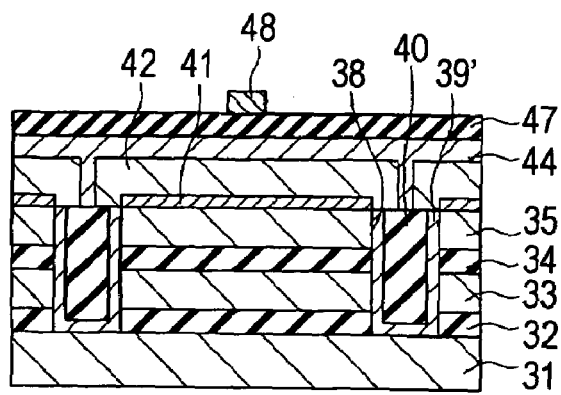

FIG. 5 is a cross-sectional view schematically illustrating a structure of a semiconductor device according to a fifth embodiment of the invention.

Referring to FIG. 5, wells 402a and 402b are formed in a semiconductor substrate 401, and insulating layers 404a and 404b are formed on the semiconductor substrate 401. In addition, semiconductor layers 405a and 405b are formed on the insulating layers 404a and 404b, respectively. In this case, the insulating layers 404a and 404b and the semiconductor layers 405a and 405b can mesa-isolate the semiconductor substrate such that portions of the wells 402a and 402b are exposed to the insulating layers 404a and 404b and the semiconductor layers 405a and 405b, respectively.

A gate electrode 407a is formed on the semiconductor layer 405a with a gate insulating layer 406a interposed therebetween and a gate electrode 407b is formed on the semiconductor layer 405b with a gate insulating layer 406b interposed therebetween. Side walls 408a are formed at sides of the gate electrode 407a and side walls 408b are formed at sides of the gate electrode 407b. At one side of the gate electrode 407a, a source layer 409a is formed in the semiconductor layer 405a via an LDD layer, and at one side of the gate electrode 407b, a source layer 409b is formed in the semiconductor layer 405b via an LDD layer. Further, at the other side of the gate electrode 407a, a drain layer 410a is formed in the semiconductor layer 405a via an LDD layer, and at the other side of the gate electrode 407b, a drain layer 410b is formed in the semiconductor layer 405b via an LDD layer. Furthermore, the gate electrodes 407a and 407b are connected to the wells 402a and 402b through a wiring layer, respectively.

Thereby, the gate electrodes 407a and 407b can be respectively connected to the wells 402a and 402b insulated from a body region, and a leakage current respectively flowing from the gate electrodes 407a and 407b to the source layers 409a and 409b can be removed. In addition, the semiconductor layers 405a and 405b can be capacitively coupled with the wells 402a and 402b, and potentials of the semiconductor layers 405a and 405b can vary in accordance with potentials of the gate electrodes 407a and 407b, respectively. For this reason, the threshold voltage can vary during operation while preventing a consumed power from increasing due to a leakage current respectively flowing from the gate electrodes 407a and 407b to the source layers 409a and 409b, and high-speed switching operation can be achieved while preventing the consumed power from increasing during operation.

FIGS. 6A, 7A, 8A, 9A, 10A, 11A, 12A, 13A, 14A, 15A, and 16A are plan views illustrating a method of manufacturing a semiconductor device according to the third embodiment of the invention, FIGS. 6B, 7B, 8B, 9B, 10B, 11B, 12B, 13B, 14B, 15B, and 16B are cross-sectional views taken along the lines VIB-VIB to XVIB-XVIB of FIGS. 6A to 16A, and FIGS. 6C, 7C, 8C, 9C, 10C, 11C, 12C, 13C, 14C, 15C, and 16C are cross-sectional views taken along the lines VIC-VIC to XVIC-XVIC of FIGS. 6A to 16A.

Referring to FIG. 6, single crystalline semiconductor layers 51, 33, 52, and 35 are sequentially laminated on a semiconductor substrate 31. In addition, the single crystalline semiconductor layers 51 and 52 may use a material having a larger etching rate than the semiconductor substrate 31 and the single crystalline semiconductor layers 33 and 35. In particular, when the semiconductor substrate 31 is formed of Si, it is preferable that the single crystalline semiconductor layers 51 and 52 be formed of SiGe, and the single crystalline semiconductor layers 33 and 35 be formed of Si. Thereby, a selection ratio between the single crystalline semiconductor layers 51 and 52 and the single crystalline semiconductor layers 33 and 35 can be secured while performing matrix matching between the single crystalline semiconductor layers 51 and 52 and the single crystalline semiconductor layers 33 and 35. In addition, impurities such as As, P, B, or the like are preferably doped in the single crystalline semiconductor layer 33 to decrease the resistivity of the single crystalline semiconductor layer 33. Alternatively, instead of the single crystalline semiconductor layers 51 and 52, a polycrystalline semiconductor layer, an amorphous semiconductor layer, or a porous single crystalline semiconductor layer may be used.

In addition, a sacrificial oxide layer 53 is formed on a surface of the single crystalline semiconductor layer 35 by carrying out thermal oxidation on the single crystalline semiconductor layer 35. Further, a method such as chemical vapor deposition (CVD) is employed to form an oxidation preventing layer 54 on an entire surface of the sacrificial oxide layer 53. In addition, a silicon nitride layer may be used as the oxidation preventing layer 54.

Next, as shown in FIG. 7, a photolithography technique and an etching technique are employed to pattern the oxidation preventing layer 54, the sacrificial oxide layer 53, and the single crystalline semiconductor layers 35, 52, 33, and 51, so that a groove 36 exposing the semiconductor substrate 31 is formed in a predetermined direction. In addition, when the semiconductor substrate 31 is exposed, the etching may be stopped on a surface of the semiconductor substrate 31, or the semiconductor substrate 31 may be overetched to form a concave portion in the semiconductor substrate 31. In addition, a formation position of the groove 36 may correspond to a portion of the element isolation region of the single crystalline semiconductor layer 33.

In addition, a photolithography technique and an etching technique are employed to pattern the oxidation preventing layer 54, the sacrificial oxide layer 53, and the single crystalline semiconductor layers 35 and 52, so that a groove 37 overlapping the groove 36 and having a larger width than the groove 36 is formed to expose a surface near both ends of the single crystalline semiconductor layer 33. In this case, a formation position of the groove 37 can correspond to the element isolation region of the semiconductor layer 35.

Alternatively, instead of exposing a surface of the single crystalline semiconductor layer 33, etching may be stopped on a surface of the single crystalline semiconductor layer 52, or the single crystalline semiconductor layer 52 may be overetched to the inside of the single crystalline semiconductor layer 52. In this case, etching of the single crystalline semiconductor layer 52 is stopped halfway, so that a surface of the single crystalline semiconductor layer 33 within the groove 36 can be prevented from being exposed. Accordingly, when the single crystalline semiconductor layers 51 and 52 are etched to be removed, a time for which the single crystalline semiconductor layer 33 within the groove 36 is exposed to an etchant or an etching gas can decrease, which results in preventing the single crystalline semiconductor layer 33 within the groove 36 from being overetched.

Subsequently, as shown in FIG. 8, a support 56, which is arranged on sides of the single crystalline semiconductor layers 33, 35, 51, and 52 and supports the single crystalline semiconductor layers 33 and 35 on the semiconductor substrate 31, is formed within the grooves 36 and 37. In addition, when the support 56 is formed at sides of the single crystalline semiconductor layers 33, 35, 51, and 52, a semiconductor epitaxial growth technique may be employed. In this case, the semiconductor epitaxial growth technique may be employed to selectively form the support 56 on sides of the single crystalline semiconductor layers 33, 35, 51, and 52 and a surface of the semiconductor substrate 31. In addition, when the semiconductor substrate 31 and the single crystalline semiconductor layers 33 and 35 are formed of Si and the single crystalline semiconductor layers 51 and 52 are formed of SiGe, the support 56 is preferably formed of Si.

Thereby, a selection ratio between the support 56 and the single crystalline semiconductor layers 51 and 52 can secured while performing lattice matching between the support 56 and the single crystalline semiconductor layers 51 and 52. In addition, the support 56 can be formed of Si, so that a three-dimensional structure through the semiconductor can be maintained even when the single crystalline semiconductor layers 51 and 52 are removed. For this reason, chemical resistance or mechanical stress resistance can be enhanced, and a stable element isolation process having high reproducibility can be achieved. Alternatively, the support 56 may be formed of an insulating material such as silicon oxide layer besides the semiconductor.

Next, as shown in FIG. 9, a photolithography technique and an etching technique are employed to pattern the oxidation preventing layer 54, the sacrificial oxide layer 53, the single crystalline semiconductor layers 35, 52, 33, and 51, so that a groove 38 exposing the semiconductor substrate 31 is formed in a direction perpendicular to the groove 36. In addition, when the semiconductor substrate 31 is exposed, etching may be stopped on a surface of the semiconductor substrate 31, or the semiconductor substrate 31 may be overetched to form a concave portion in the semiconductor substrate 31. In addition, a formation position of the groove 38 may correspond to the element isolation region of the single crystalline semiconductor layers 33 and 35.

Next, as shown in FIG. 10, an etching gas or etchant is made to be in contact with the single crystalline semiconductor layers 51 and 52 through the groove 38 to remove the single crystalline semiconductor layers 51 and 52 by etching, so that a cavity 57a is formed between the semiconductor substrate 31 and the single crystalline semiconductor layer 33 and a cavity 57b is formed between the single crystalline semiconductor layers 33 and 35.

In this case, even when the support 56 is formed within the grooves 36 and 37 and the single crystalline semiconductor layers 51 and 52 are removed, the single crystalline semiconductor layers 33 and 35 can be supported on the semiconductor substrate 31. In addition, a groove 38 is formed besides the grooves 36 and 37, so that the etching gas or the etchant can be brought into contacts with the single crystalline semiconductor layers 51 and 52 arranged below the single crystalline semiconductor layers 33 and 35. Accordingly, insulation between the single crystalline semiconductor layers 33 and 35 and the semiconductor substrate 31 can be secured while crystalline qualities of the single crystalline semiconductor layers 33 and 35 are not deteriorated.

In addition, when the semiconductor substrate 31, the single crystalline semiconductor layers 33 and 35, and the support 56 are formed of Si and the single crystalline semiconductor layers 51 and 52 are formed of SiGe, fluoronitryl acid is preferably used as etchant for the single crystalline semiconductor layers 51 and 52. Accordingly, a selection ratio between Si and SiGe can be obtained in a range of 1:1000 to 10000, so that the semiconductor substrate 31, the single crystalline semiconductor layers 33 and 35, and the support 56 can be prevented from being overetched while the single crystalline semiconductor layers 51 and 52 can be removed.

Next, as shown in FIG. 11, thermal oxidation is carried out on the semiconductor substrate 31, the single crystalline semiconductor layers 33 and 35, and the support 56, thereby forming an insulating layer 32 in the cavity 57a between the semiconductor substrate 31 and the single crystalline semiconductor layer 33 while forming an insulating layer 34 in the cavity 57b between the single crystalline semiconductor layers 33 and 35. In this case, when the thermal oxidation is carried out on the semiconductor substrate 31, the single crystalline semiconductor layers 33 and 35, and the support 56 to form the insulating layers 32 and 34, the semiconductor substrate 31 and the single crystalline semiconductor layers 33 and 35 within the groove 38 are oxidized, so that an oxide layer 39' can be formed on an inner side of the groove 38 and the support 56 can be transformed to an oxide layer 39.

Thereby, each thickness of the single crystalline semiconductor layers 33 and 35 after element isolation can be defined in accordance with thicknesses of the single crystalline semiconductor layers 33 and 35 at the time of epitaxial growth and thicknesses of the insulating layers 32 and 34 formed at the time of carrying out the thermal oxidation on the single crystalline semiconductor layers 33 and 35. Accordingly, thicknesses of the single crystalline semiconductor layers 33 and 35 can be accurately controlled, so that a deviation of the thicknesses of the single crystalline semiconductor layers 33 and 35 can decrease and the single crystalline semiconductor layers 33 and 35 can become thinner. In addition, the oxidation preventing layer 54 is formed on the single crystalline semiconductor layer 35, so that a surface of the single crystalline semiconductor layer 35 can be prevented from being thermally oxidized, and the insulating layer 34 can be formed at a rear side of the single crystalline semiconductor layer 35.

In addition, formation positions of the grooves 36 and 38 correspond to an element isolation region of the single crystalline semiconductor layer 33, and formation positions of the grooves 37 and 38 correspond to the element isolation region of the single crystalline semiconductor layer 35. As a result, horizontal element isolation and vertical element isolation of the single crystalline semiconductor layers 33 and 35 can be collectively carried out, and the groove for removing the single crystalline semiconductor layers 51 and 52 does not need to be formed in the element formation region. Accordingly, the number of processes can be prevented from increasing and an SOI transistor can be formed. In addition, a chip size can be suppressed from increasing and a cost of the SOI transistor can decrease.

In addition, after formation of the insulating layers 32 and 34, annealing may be carried out at a high temperature. Thereby, the insulating layers 32 and 34 can be reflowed, stress of the insulating layers 32 and 34 can be alleviated, and an interface level can decrease. Alternatively, instead of the method of carrying out thermal oxidation on the semiconductor substrate 31 and the single crystalline semiconductor layers 33 and 35 to form the insulating layers 32 and 34, insulating materials may be deposited within cavities 57a and 57b by the CVD method, so that the insulating layers 32 and 34 may be formed.

Next, as shown in FIG. 12, a CVD method is employed to allow the grooves 36 and 37 and the groove 38 where the oxide layers 39 and 39' are formed to be buried, so that an insulating layer is deposited on the single crystalline semiconductor layer 35. Further, a method such as chemical mechanical polishing (CMP) is employed to planarize the insulating layer, so that a surface of the single crystalline semiconductor layer 35 is exposed to form a buried insulating layer 40 within the grooves 36 to 38. In addition, $SiO_2$ or $Si_3N_4$ may be used as the buried insulating layer 40.

Next, as shown in FIG. 13, thermal oxidation is carried out on the single crystalline semiconductor layer 35 to form a gate insulating layer 41 on the single crystalline semiconductor layer 35. Further, a method such as CVD is employed to form a polycrystalline silicon layer on the single crystalline semiconductor layer 35 where the gate insulating layer 41 is formed, and a photolithography technique and a dry etching technique are employed to pattern the polycrystalline silicon layer, so that a gate electrode 42 is formed on the gate insulating layer 41.

Next, as shown in FIG. 14, impurities such as As, P, B or the like are injected into the single crystalline semiconductor layer 35 using the gate electrode 42 as a mask, so that a source layer 43a and a drain layer 43b each formed of a highly doped impurity introducing layer arranged at sides of the gate electrode 42 are formed in the single crystalline semiconductor layer 35. Alternatively, impurities such as As, P, B, or the like may be injected into the single crystalline semiconductor layer 33 to decrease resistivity of the single crystalline semiconductor layer 33.

Next, as shown in FIG. 15, the interlayer insulating layer 44 is then deposited by a method such as plasma CVD. In addition, a photolithography technique and an etching technique are employed to pattern the interlayer insulating layer 44, so that an opening is formed to expose surfaces of the source layer 43a and the drain layer 43b. In addition, a photolithography technique and an etching technique are employed to pattern the interlayer insulating layer 44, the buried insulating layer 40, and the oxide layer 39, so that an opening is formed to expose a surface of the single crystalline semiconductor layer 33.

These openings are buried by a method such as CVD to deposit a conductive layer on the interlayer insulating layer 44. Further, a photolithography technique and an etching technique are employed to pattern the conductive layer, so that wiring layers 46a and 46b coming in contacts with the source layer 43a and the drain layer 43b are formed on the interlayer insulating layer 44, and wiring layers 45a and 45b coming in contact with the signal crystalline semiconductor layer 33 are formed on the interlayer insulating layer 44. In this case, the wiring layers 45a, 45b, 46a, and 46b may form any wiring patterns by means of a circuit. For example, when the wiring layers 45a and 46b are patterned so as to be connected to each other, source and field plates can be made to have the same potential.

Next, as shown in FIG. 16, an interlayer insulating layer 47 is deposited on a resultant surface by a plasma CVD method or the like. In addition, a photolithography technique and an etching technique are employed to pattern the interlayer insulating layer 47, so that an opening is formed to expose surfaces of the wiring layers 45a and 45b and the gate electrode 42. Further, the opening formed in the interlayer insulating layer 47 is buried by a CVD method to deposit a conductive layer on the interlayer insulating layer 47. Furthermore, a photolithography technique and an etching technique are employed to pattern the conductive layer, so that a wiring layer 48 is formed on the interlayer insulating layer 47 so as to connect the wiring layers 45a and 45b to the gate electrode 42.

Thereby, the thermal oxidation of the semiconductor substrate 31 and the single crystalline semiconductor layers 33 and 35 allows a box layer to formed, so that crystalline qualities of the single crystalline semiconductor layers 33 and 35 are not deteriorated and the SOI transistor can be formed. In addition, the threshold voltage at the time of operating the SOI transistor can vary. Accordingly, the threshold voltage can vary during operation while preventing the consumed power from increasing due to a leakage current flowing from the gate electrode 42 to the source layer 43a, and high-speed switching operation can be achieved while preventing the consumed power from increasing during operation.

The entire disclosure of Japanese Patent Application No. 2004-354108, filed Dec. 7, 2004 is expressly incorporated by reference herein.

What is claimed is:

1. A semiconductor device comprising:
    a first semiconductor layer that is formed over a first insulating layer;
    a second insulating layer that is formed over the first semiconductor layer;
    a second semiconductor layer that is formed over the second insulating layer;
    a first gate electrode that is formed over the second semiconductor layer;
    first conductive source and drain layers that are formed in the second semiconductor layer and are arranged at sides of the gate electrode;
    a first wiring layer that electrically connects the first gate electrode to the first semiconductor layer;
    a third insulating layer that is formed over the first semiconductor layer;
    a third semiconductor layer that is formed over the third insulating layer;
    a second gate electrode that is formed over the third semiconductor layer;
    second conductive source and drain layers that are formed in the third semiconductor layer and are arranged at sides of the second gate electrode; and
    a second wiring layer that electrically connects the first conductive drain layer to the second conductive drain layer,
    wherein the first wiring layer electrically connects the first semiconductor layer to both the first gate electrode and the second gate electrode.

* * * * *